(12) United States Patent
Iijima et al.

(10) Patent No.: US 11,532,589 B2
(45) Date of Patent: Dec. 20, 2022

(54) SEMICONDUCTOR WAFER AND METHOD OF MANUFACTURING THE SAME

(71) Applicant: Kioxia Corporation, Tokyo (JP)

(72) Inventors: Jun Iijima, Yokkaichi (JP); Hiroshi Nakaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 21 days.

(21) Appl. No.: 17/010,196

(22) Filed: Sep. 2, 2020

(65) Prior Publication Data

US 2021/0296277 A1 Sep. 23, 2021

(30) Foreign Application Priority Data

Mar. 23, 2020 (JP) .............................. JP2020-051539

(51) Int. Cl.
*H01L 31/14* (2006.01)
*H01L 27/146* (2006.01)
(Continued)

(52) U.S. Cl.
CPC .............. *H01L 24/32* (2013.01); *H01L 21/78* (2013.01); *H01L 24/03* (2013.01); *H01L 24/08* (2013.01); *H01L 24/27* (2013.01); *H01L 24/83* (2013.01); *H01L 24/94* (2013.01); *H01L 25/18* (2013.01); *H01L 25/50* (2013.01); *H01L 27/11556* (2013.01); *H01L 27/11582* (2013.01); *H01L 2224/08145* (2013.01); *H01L 2224/2762* (2013.01); *H01L 2224/27614* (2013.01); *H01L 2224/27845* (2013.01); *H01L 2224/29078* (2013.01); *H01L 2224/29194* (2013.01); *H01L 2224/32145* (2013.01);
(Continued)

(58) Field of Classification Search
CPC ............................................ H01L 2224/08145
See application file for complete search history.

(56) References Cited

U.S. PATENT DOCUMENTS 8,859,391 B2 * 10/2014 Matsugai .......... H01L 27/14685
438/692
2013/0161821 A1 * 6/2013 Hwang ............. H01L 27/11556
257/773
(Continued)

FOREIGN PATENT DOCUMENTS

JP 2012-174937 A 9/2012

*Primary Examiner* — Bradley Smith
*Assistant Examiner* — David J Goodwin
(74) *Attorney, Agent, or Firm* — Oblon, McClelland, Maier & Neustadt, L.L.P.

(57) ABSTRACT

In one embodiment, a semiconductor wafer includes a first substrate, a first insulator provided on the first substrate, and a plurality of first pads provided in the first insulator. The wafer further includes a second insulator provided on the first insulator, a plurality of second pads provided on the first pads in the second insulator, a stacked film alternately including a plurality of first insulating layers and a plurality of second insulating layers provided in the second insulator, and a second substrate provided on the second insulator. Furthermore, the first insulator and the second insulator are connected to each other between an edge face of the first insulator and an edge face of the second insulator, and the second insulator intervenes between the first insulator and the stacked film at the edge faces of the first and second insulators.

7 Claims, 23 Drawing Sheets

(51) Int. Cl.
    *H01L 23/00*     (2006.01)
    *H01L 21/78*     (2006.01)
    *H01L 25/18*     (2006.01)
    *H01L 25/00*     (2006.01)
    *H01L 27/11556*     (2017.01)
    *H01L 27/11582*     (2017.01)

(52) U.S. Cl.
    CPC ............... *H01L 2224/80895* (2013.01); *H01L 2224/83896* (2013.01); *H01L 2224/92142* (2013.01); *H01L 2924/1431* (2013.01); *H01L 2924/14511* (2013.01)

(56) References Cited

U.S. PATENT DOCUMENTS

2019/0221557 A1*   7/2019   Kim ................... H01L 27/11582
2021/0134663 A1*   5/2021   Huang .............. H01L 21/02274

\* cited by examiner

US 11,532,589 B2

SEMICONDUCTOR WAFER AND METHOD OF MANUFACTURING THE SAME

CROSS REFERENCE TO RELATED APPLICATION

This application is based upon and claims the benefit of priority from the prior Japanese Patent Application No. 2020-051539, filed on Mar. 23, 2020, the entire contents of which are incorporated herein by reference.

FIELD

Embodiments described herein relate to a semiconductor wafer and a method of manufacturing the same.

BACKGROUND

When a semiconductor device is manufactured by bonding metal pads of wafers (substrates), it is desired to reduce wasteful disposal of edge portions of the wafers.

DETAILED DESCRIPTION

In one embodiment, a semiconductor wafer includes a first substrate, a first insulator provided on the first substrate, and a plurality of first pads provided in the first insulator. The wafer further includes a second insulator provided on the first insulator, a plurality of second pads provided on the first pads in the second insulator, a stacked film alternately including a plurality of first insulating layers and a plurality of second insulating layers provided in the second insulator, and a second substrate provided on the second insulator. Furthermore, the first insulator and the second insulator are connected to each other between an edge face of the first insulator and an edge face of the second insulator, and the second insulator intervenes between the first insulator and the stacked film at the edge faces of the first and second insulators.

Embodiments will now be explained with reference to the accompanying drawings. In FIGS. 1 to 23, the same components are denoted by the same reference symbols and duplicate descriptions thereof will be omitted.

First Embodiment

Figure 1:
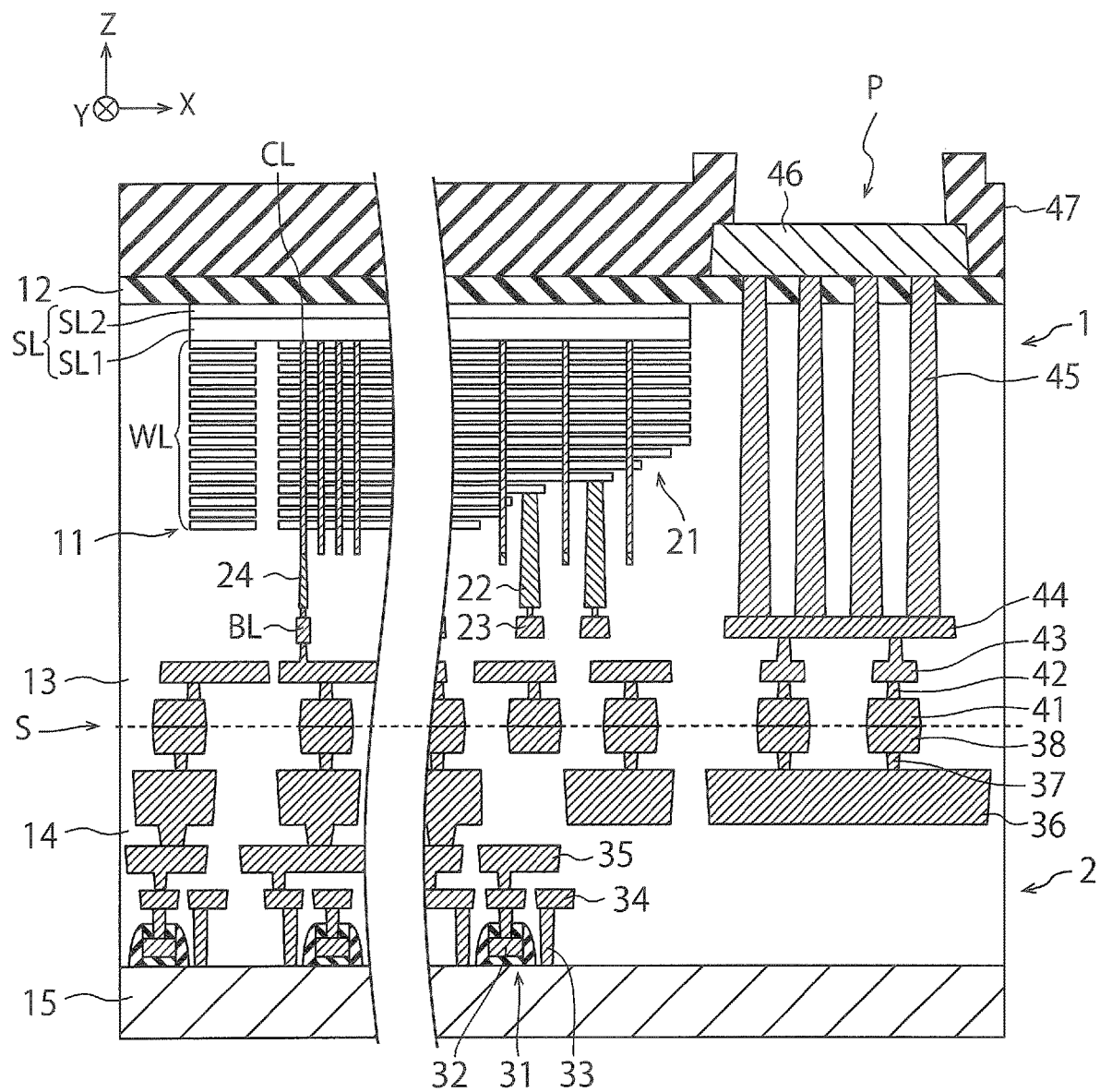
FIG. 1 is a cross-sectional view illustrating the structure of a semiconductor device of a first embodiment.

FIG. 1 is a cross-sectional view illustrating the structure of a semiconductor device of the first embodiment. The semiconductor device illustrated in FIG. 1 is a three-dimensional memory including an array chip 1 and a circuit chip 2 that are bonded together.

The array chip 1 includes a memory cell array 11 including a plurality of memory cells, an insulator 12 on the memory cell array 11, and an inter layer dielectric 13 under the memory cell array 11. The insulator 12 is, for example, a silicon oxide film, or a silicon nitride film. The inter layer dielectric 13 is, for example, a silicon oxide film, or a stacked film including a silicon oxide film and another insulator. The inter layer dielectric 13 is an example of a second insulator.

The circuit chip 2 is provided below the array chip 1. The array chip 1 and the circuit chip 2 are bonded at a bonding face, indicated by reference symbol S. The circuit chip 2 includes an inter layer dielectric 14, and a substrate 15 under the inter layer dielectric 14. The inter layer dielectric 14 is, for example, a silicon oxide film, or a stacked film including a silicon oxide film and another insulator. The inter layer dielectric 14 is an example of a first insulator. The substrate 15 is, for example, a semiconductor substrate such as a silicon substrate.

FIG. 1 illustrates X and Y directions that are parallel to a surface of the substrate 15 and are perpendicular to each other, and Z direction that is perpendicular to the surface of the substrate 15. In the present specification, +Z direction is treated as an upward direction, and -Z direction is treated as a downward direction. The -Z direction may or may not match the direction of gravity.

The array chip 1 includes, as electrode layers in the memory cell array 11, a plurality of word lines WL, and a source line SL. FIG. 1 illustrates a stairway structure portion 21 of the memory cell array 11. Each word line WL is electrically connected to a word line layer 23 via a contact plug 22. Each columnar portion CL penetrating the plurality of word lines WL is electrically connected to a bit line BL via a via plug 24, and is electrically connected to the source line SL. The source line SL includes a primary layer SL1 that is a semiconductor layer and a secondary layer SL2 that is a metal layer.

The circuit chip 2 includes a plurality of transistors 31. Each transistor 31 includes a gate electrode 32 provided on the substrate 15 via a gate insulator, and a source diffusion layer (not illustrated) and a drain diffusion layer (not illustrated) that are provided in the substrate 15. Further, the circuit chip 2 includes a plurality of contact plugs 33 provided on the gate electrode 32, the source diffusion layer, or the drain diffusion layer of these transistors 31, a line layer 34 provided on these contact plugs 33 and including a plurality of lines, and a line layer 35 provided on the line layer 34 and including a plurality of lines.

The circuit chip 2 further includes a line layer 36 provided on the line layer 35 and including a plurality of lines, a plurality of via plugs 37 provided on the line layer 36, and a plurality of metal pads 38 provided on these via plugs 37. The metal pad 38 is, for example, a copper (Cu) layer or an aluminum (Al) layer. The metal pad 38 is an example of a first pad. The circuit chip 2 functions as a control circuit (a logic circuit) that controls operations of the array chip 1. The control circuit is configured with the transistors 31 and the like, and is electrically connected to the metal pads 38.

The array chip 1 includes a plurality of metal pads 41 provided on the metal pads 38 and a plurality of via plugs 42 provided on the metal pads 41. Further, the array chip 1 includes a line layer 43 provided on these via plugs 42 and including a plurality of lines, and a line layer 44 provided on the line layer 43 and including a plurality of lines. The metal pad 41 is, for example, a Cu layer or an Al layer. The metal pad 41 is an example of a second pad. The above-mentioned bit line BL is included in the line layer 44. The control circuit is electrically connected to the memory cell array 11 via the metal pads 41 and 38 and the like, and controls operations of the memory cell array 11 via the metal pads 41 and 38 and the like. The array chip 1 further includes a plurality of via plugs 45 provided on the line layer 44, a metal pad 46 provided on these via plugs 45 or on the insulator 12, and a passivation film 47 provided on the metal pad 46 or on the insulator 12. The metal pad 46 is, for example, a Cu layer or an Al layer, and functions as an external connection pad (a bonding pad) of the semiconductor device illustrated in FIG. 1. The passivation film 47 is, for example, an insulator such as a silicon oxide film, and has an aperture P that exposes an upper face of the metal pad 46. The metal pad 46 can be connected, through the aperture P, to mounting substrate or another device by means of a bonding wire, a solder ball, a metal bump, or the like.

Figure 2:
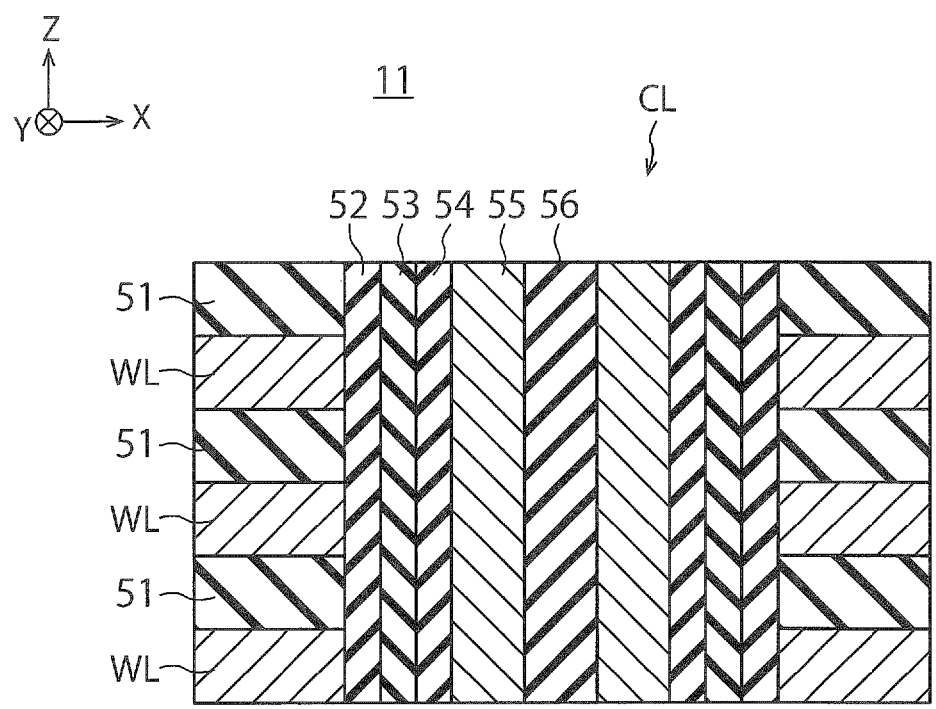
FIG. 2 is a cross-sectional view illustrating the structure of a columnar portion CL of the first embodiment.

FIG. 2 is a cross-sectional view illustrating the structure of the columnar portion CL of the first embodiment.

As illustrated in FIG. 2, the memory cell array 11 includes the plurality of word lines WL and a plurality of insulating layers 51 that are alternately stacked on the inter layer dielectric 13 (see FIG. 1). The word line WL is, for example, a tungsten (W) layer. The insulating layer 51 is, for example, a silicon oxide film.

The columnar portion CL includes a block insulator 52, a charge storage layer 53, a tunnel insulator 54, a channel semiconductor layer 55, and a core insulator 56 that are sequentially arranged. The charge storage layer 53 is, for example, a silicon nitride film, and is formed, via the block insulator 52, on side faces of the word lines WL and the insulating layers 51. The charge storage layer 53 may be a semiconductor layer such as a polysilicon layer. The channel semiconductor layer 55 is, for example, a polysilicon layer, and is formed, via the tunnel insulator 54, on a side face of the charge storage layer 53. Each of the block insulator 52, the tunnel insulator 54, and the core insulator 56 is, for example, a silicon oxide film or a metal insulator.

Figure 3:
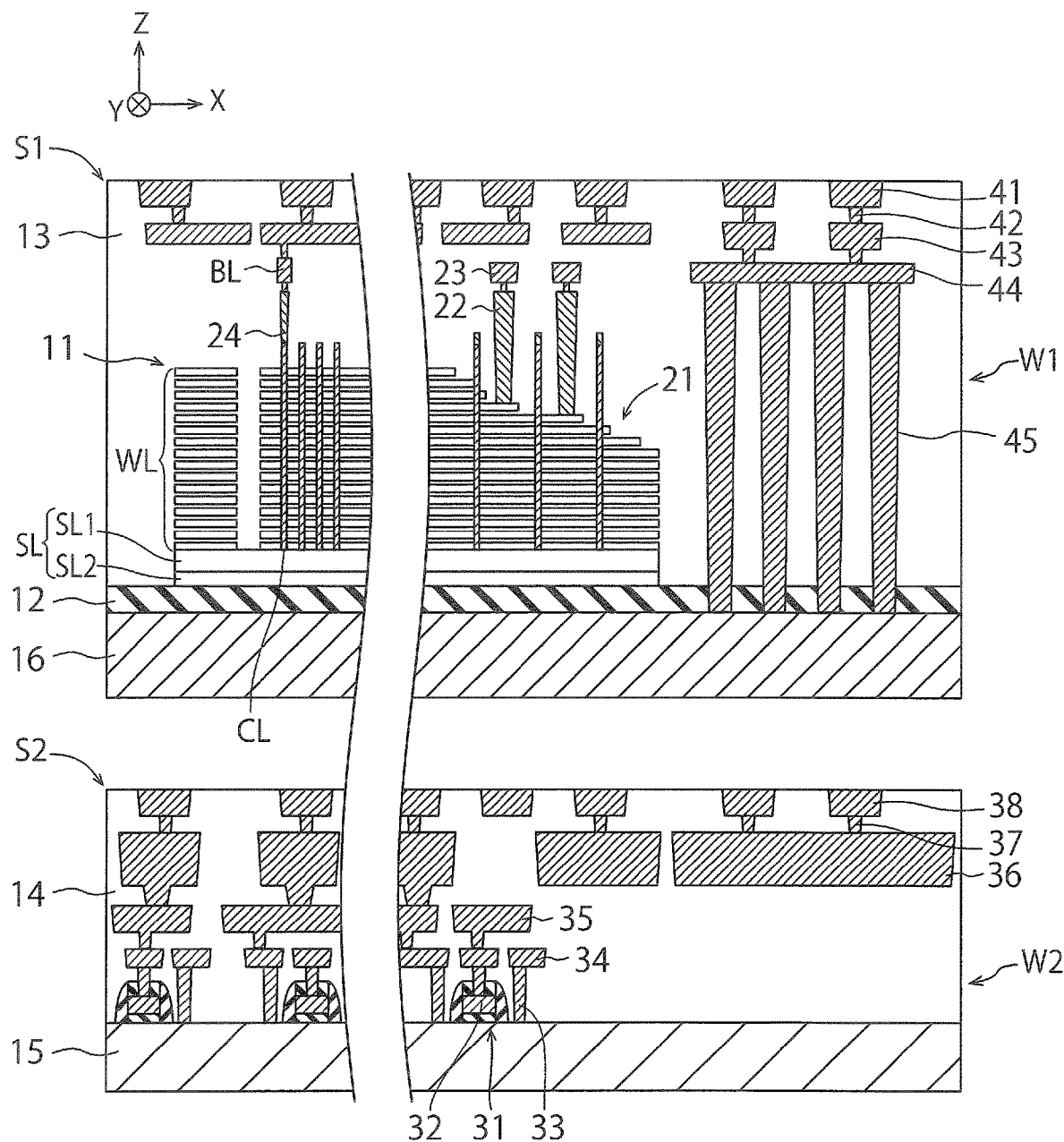
FIGS. 3 and 4 are cross-sectional views illustrating a method of manufacturing the semiconductor device of the first embodiment.
Figure 4:
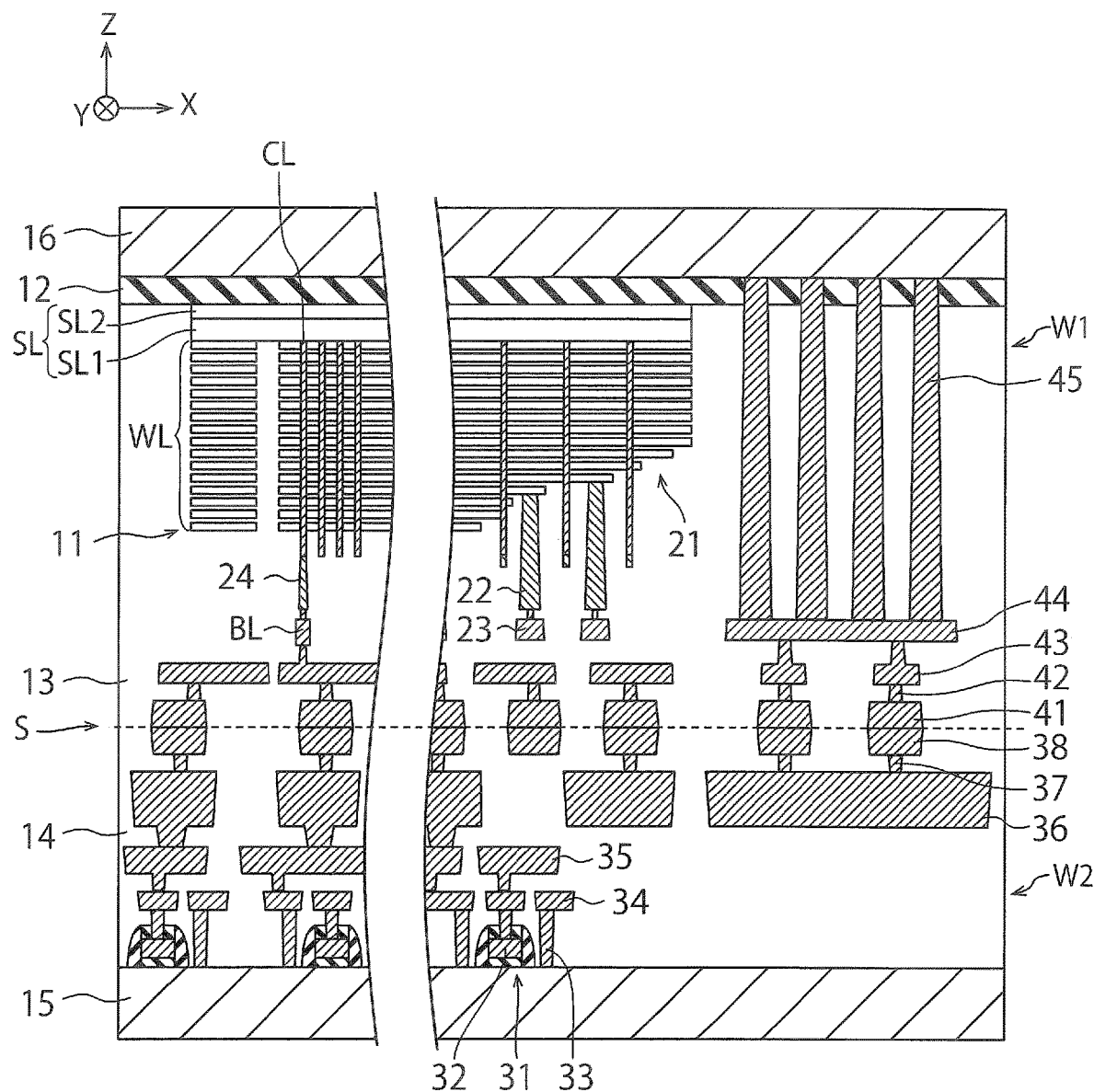

FIGS. 3 and 4 are cross-sectional views illustrating a method of manufacturing the semiconductor device of the first embodiment.

FIG. 3 illustrates an array wafer W1 including a plurality of array chips 1, and a circuit wafer W2 including a plurality of circuit chips 2. The array wafer W1 is also called a "memory wafer", and the circuit wafer W2 is also called a "CMOS wafer".

Note that the orientation of the array wafer W1 illustrated in FIG. 3 is opposite to the orientation of the array chip 1 illustrated in FIG. 1. In the present embodiment, the array wafer W1 and the circuit wafer W2 are bonded together to manufacture a semiconductor device. FIG. 3 illustrates a state of the array wafer W1 before the orientation thereof is turned over for bonding, and FIG. 1 illustrates a state of the array chip 1 after the orientation thereof is turned over for bonding and then bonded and diced.

In FIG. 3, reference symbol S1 indicates an upper face of the array wafer W1, and reference symbol S2 indicates an upper face of the circuit wafer W2. Note that the array wafer W1 includes a substrate 16 provided under the insulator 12. The substrate 16 is, for example, a semiconductor substrate such as a silicon substrate. The substrate 15 is an example of a first substrate, and the substrate 16 is an example of a second substrate. Each of the substrate 15 and the substrate 16 illustrated in illustrated in FIG. 3 is a semiconductor wafer before being diced and has a disk shape.

In the present embodiment, the manufacturing method includes, first, forming the memory cell array 11, the insulator 12, the inter layer dielectric 13, the stairway structure portion 21, and the metal pads 41, and the like on the substrate 16 of the array wafer W1, and then forming the inter layer dielectric 14, the transistors 31, the metal pads 38, and the like on the substrate 15 of the circuit wafer W2, as illustrated in FIG. 3. For example, the via plugs 45, the line layer 44, the line layer 43, the via plugs 42, and the metal pads 41 are sequentially formed on the substrate 16. Further, the contact plugs 33, the line layer 34, the line layer 35, the line layer 36, the via plugs 37, and the metal pads 38 are sequentially formed on the substrate 15. The method includes subsequently bonding the array wafer W1 and the circuit wafer W2 together under a mechanical pressure, as illustrated in FIG. 4. As a result, the inter layer dielectric 13 and the inter layer dielectric 14 are bonded together. The method includes subsequently annealing the array wafer W1 and the circuit wafer W2 at 400° C. As a result, the metal pads 41 and the metal pads 38 are joined together.

The method includes subsequently thinning the substrate 15 by chemical mechanical polishing (CMP), and after removing the substrate 16 by CMP, cutting the array wafer W1 and the circuit wafer W2 into a plurality of chips. In this way, the semiconductor device of FIG. 1 is manufactured. FIG. 1 illustrates the circuit chip 2 including the metal pads 38 and the inter layer dielectric 14, and the array chip 1 including the metal pads 41 and the inter layer dielectric 13 disposed on the metal pads 38 and the inter layer dielectric 14, respectively. The metal pad 46 and the passivation film 47 are, for example, formed on the insulator 12, after the thinning of the substrate 15 and the removal of the substrate 16.

In the present embodiment, although the array wafer W1 and the circuit wafer W2 are bonded together, it may be feasible to bond the array wafers W1 together instead. The above contents described with reference to FIGS. 1 to 4 and the below contents that will be described with reference to FIGS. 5A to 23 are also applicable to the bonding of the array wafers W1.

Further, although FIG. 1 illustrates a boundary face between the inter layer dielectric 13 and the inter layer dielectric 14 and a boundary face between the metal pads 41 and the metal pads 38, these boundary faces are not observed after the above-described annealing, generally. However, the positions where these boundary faces were present can be estimated by detecting, for example, the inclination of the side face of the metal pad 41 or the side face of the metal pad 38 or the positional deviation between the side face of the metal pad 41 and the side face of the metal pad 38.

The semiconductor device of the present embodiment may be an object to be transacted in the state illustrated in FIG. 1 after having been cut into a plurality of chips, or may be an object to be transacted in the state illustrated in FIG. 4 before being cut into a plurality of chips. FIG. 1 illustrates the semiconductor device in a chip state, and FIG. 4 illustrates the semiconductor device in a wafer state. In the present embodiment, a plurality of chip-state semiconductor devices (see FIG. 1) can be manufactured from a single wafer-state semiconductor device (see FIG. 4). The wafer-state semiconductor device illustrated in FIG. 4 becomes an object to be transacted, for example, in a state after trimming described below. The wafer-state semiconductor device illustrated in FIG. 4 is an example of the semiconductor wafer.

Hereinafter, with reference to FIGS. 5A to 11, the method of manufacturing the semiconductor device of the present embodiment will be described in more detail.

FIGS. 5A to 8B are cross-sectional views illustrating a method of manufacturing the array wafer W1 of the first embodiment.

Figure 5A:
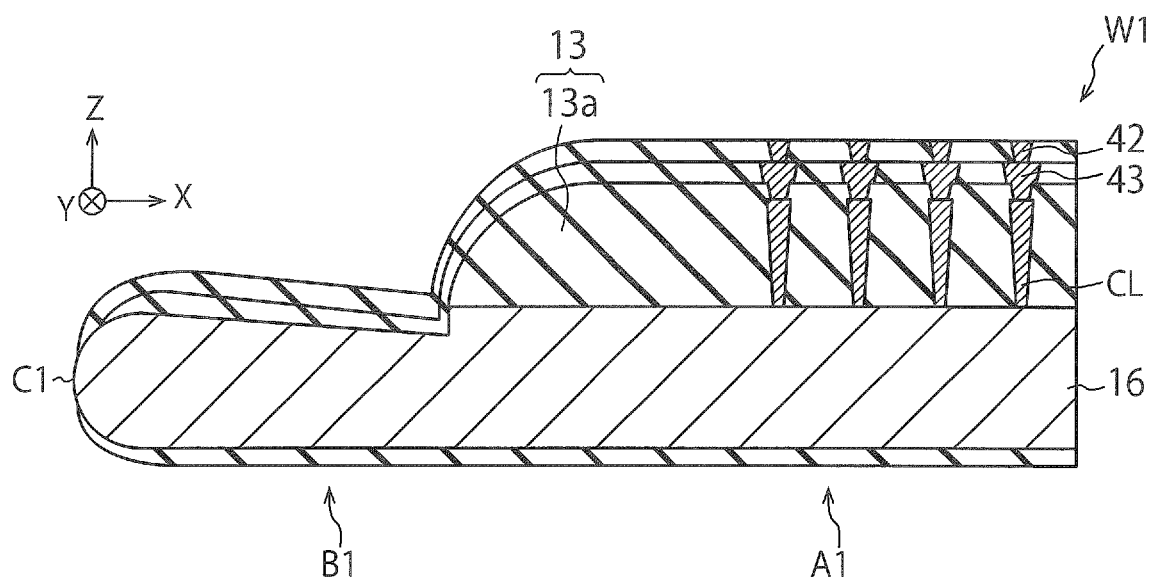
FIGS. 5A to 8B are cross-sectional views illustrating a method of manufacturing an array wafer W1 of the first embodiment.

FIG. 5A illustrates the substrate 16, an insulator 13a that is a portion of the inter layer dielectric 13, and a plurality of columnar portions CL formed in the insulator 13a. However, the insulator 12 and the source line SL between the substrate and the columnar portions CL are not illustrated (as understood in comparison with FIG. 3). The insulator 13a is an example of a first film.

FIG. 5A further illustrates the line layer 43 and the plurality of via plugs 42 sequentially formed on these columnar portions CL in the insulator 13a. However, the via plug 24 and the bit line BL (the line layer 43) between the columnar portion CL and the line layer 43 are not illustrated (as understood in comparison with FIG. 3).

As described above, FIG. 5A illustrates a stage after the via plugs 42 have been formed in the process illustrated in FIG. 3 and before the metal pads 41 are formed.

The substrate 16 illustrated in FIG. 5A is a semiconductor wafer before being diced and has a disk shape. FIG. 5A further illustrates a central portion A1, an edge portion B1, and an outermost portion C1 of the substrate 16. The central portion A1 is a region on the central axis side of the substrate 16, and the edge portion B1 is a region on the outermost portion C1 side of the substrate 16. The edge portion B1 of the present embodiment has an annular (ring-like) shape surrounding the central portion A1.

In the present embodiment, an upper face of the edge portion B1 of the substrate 16 is lower than an upper face of the central portion A1 of the substrate 16. Further, an upper face of the insulator 13a on the edge portion B1 is lower than an upper face of the insulator 13a on the central portion A1. The reason is because the surface of the substrate 16 and the surface of the insulator 13a are excessively polished in the edge portion B1 when the surface of the substrate 16 and the surface of the insulator 13a are planarized by CMP in the process illustrated in FIG. 3. In FIG. 5A, the difference in level in the vertical direction between the upper face of the insulator 13a on the edge portion B1 and the upper face of the insulator 13a on the central portion A1 is, for example, 1 to 2 µm, and is approximately 1.5 µm in this embodiment.

When such a difference in level remains until the array wafer W1 and the circuit wafer W2 are bonded, the inter layer dielectric 13 on the edge portion B1 is not bonded to the inter layer dielectric 14. That is, the surface of the inter layer dielectric 13 on the edge portion B1 becomes an unbonded area. In the present embodiment, the array wafer W1 and the circuit wafer W2 above and below the unbonded area are cut by trimming. Therefore, when the unbonded area is wider, the array wafer W1 and the circuit wafer W2 have smaller effective chip areas, and trimming portions of the array wafer W1 and the circuit wafer W2 are wastefully discarded. Accordingly, in the present embodiment, it is desired to reduce wasteful disposal of the edge portion B1.

Therefore, in the present embodiment, the above-described difference in level is eliminated by the following method.

Figure 5B:
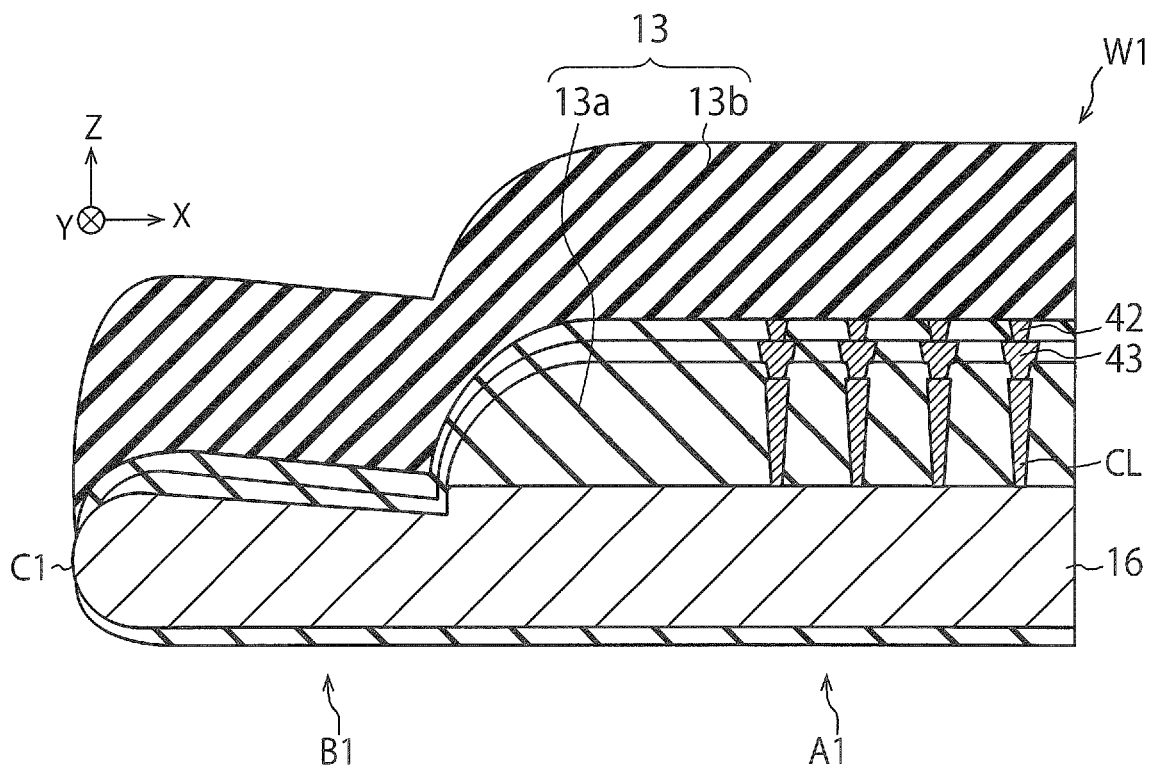

The method includes subsequently forming an insulator 13b that is a portion of the inter layer dielectric 13, via the insulator 13a, above the central portion A1 and the edge portion B1 of the substrate 16 (see FIG. 5B). The insulator 13b is, for example, a densified tetraethyl orthosilicate (dTEOS) film, and is formed to have a thickness of 1 to 2 µm. Note that in FIG. 5B, the upper face of the insulator 13b above the edge portion B1 is lower than the upper face of the insulator 13b above the central portion A1. The insulator 13b is an example of a second film.

Figure 6A:
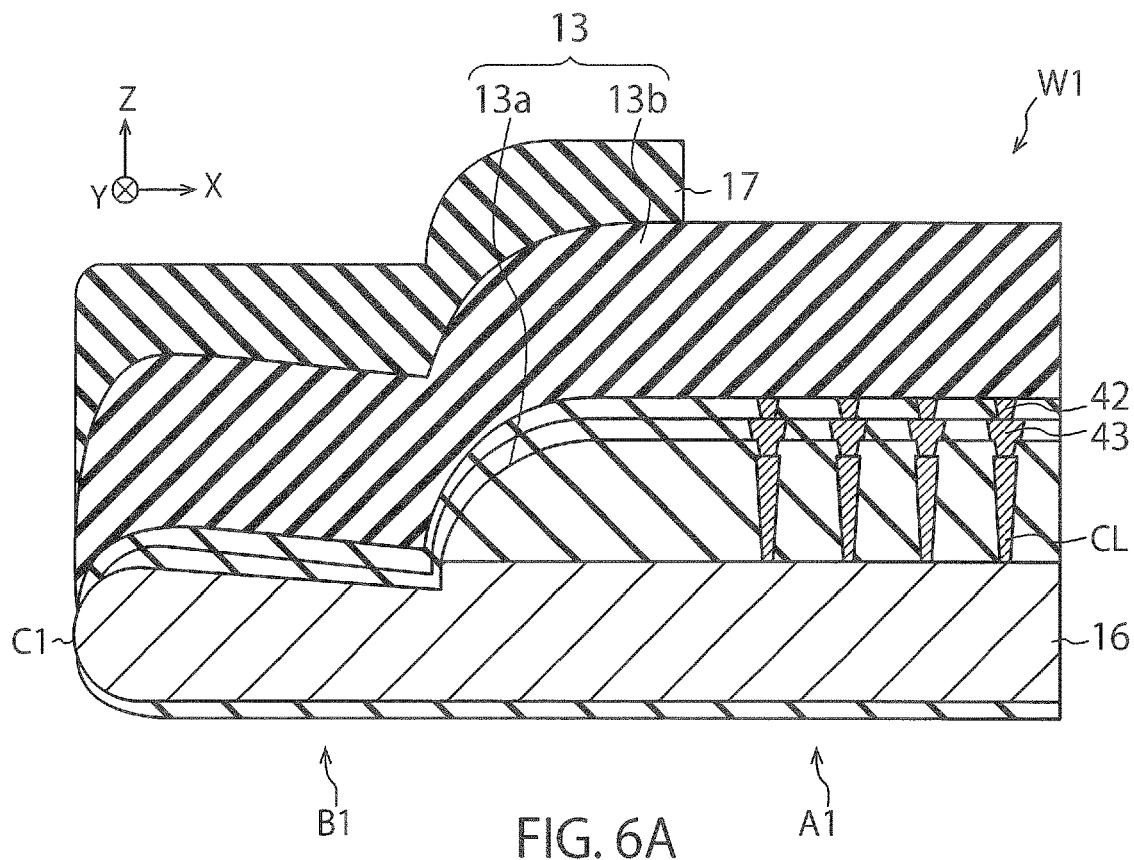

The method includes subsequently forming a resist film 17, via the insulator 13a and the insulator 13b, above the central portion A1 and the edge portion B1 of the substrate 16 (see FIG. 6A). The resist film 17 is formed so as to have a thickness of, for example, approximately 1 µm.

The method includes subsequently removing the resist film 17 above the central portion A1 of the substrate 16 (see FIG. 6A). At this time, the resist film 17 above the central portion A1 is partly removed (namely, not entirely removed). Specifically, the resist film 17 in the vicinity of the boundary between the central portion A1 and the edge portion B1, of the resist film 17 above the central portion A1, is left.

Figure 6B:
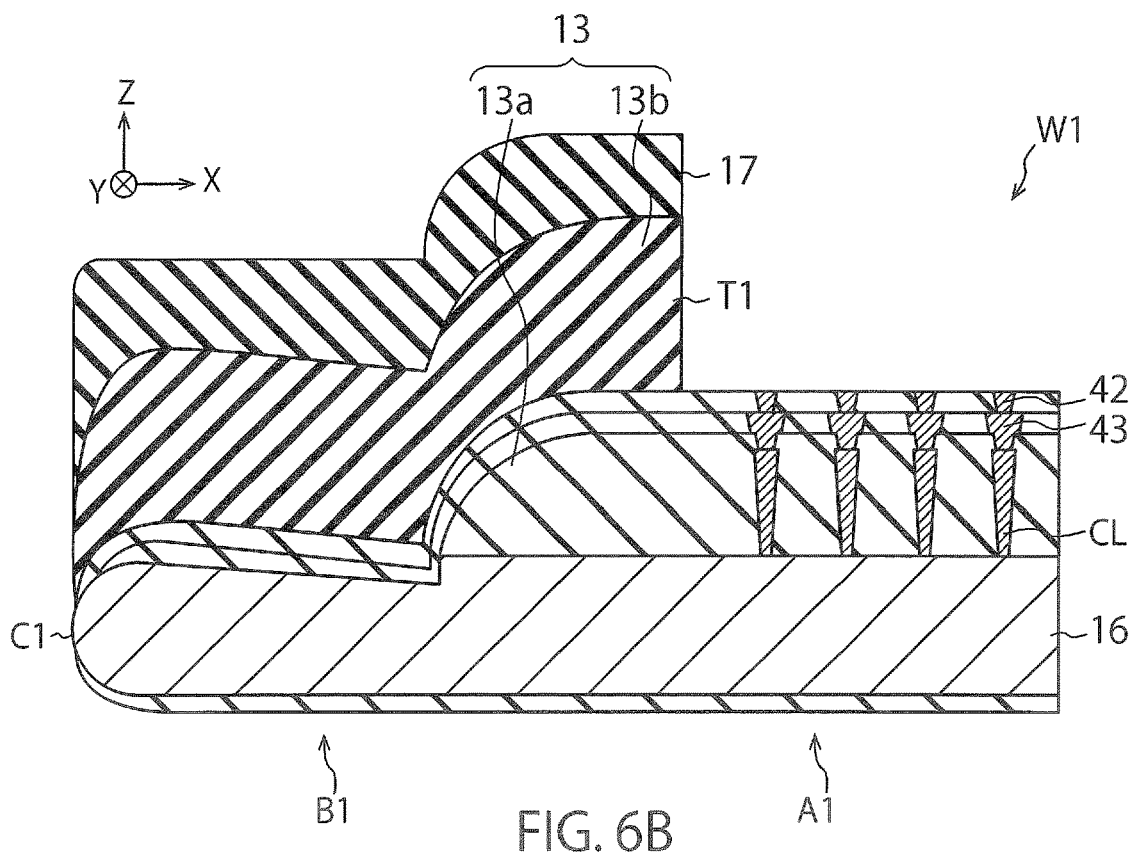

The method includes subsequently removing the insulator 13b above the central portion A1 of the substrate 16 by etching using the resist film 17 (see FIG. 6B). At this time, since only the insulator 13b exposed from the resist film 17 is removed, the insulator 13b above the central portion A1 is partly removed (namely, not entirely removed). Specifically, the insulator 13b in the vicinity of the boundary between the central portion A1 and the edge portion B1, of the insulator 13b above the central portion A1, remains. FIG. 6B illustrates a protruding portion T1 of the insulator 13b remaining in the vicinity of the boundary between the central portion A1 and the edge portion B1. The protruding portion T1 of the present embodiment has an annular shape that is similar to that of the edge portion B1. The etching in the process illustrated in FIG. 6B is, for example, wet etching using a liquid medicine containing buffered hydrofluoric acid (BHF).

Figure 7A:
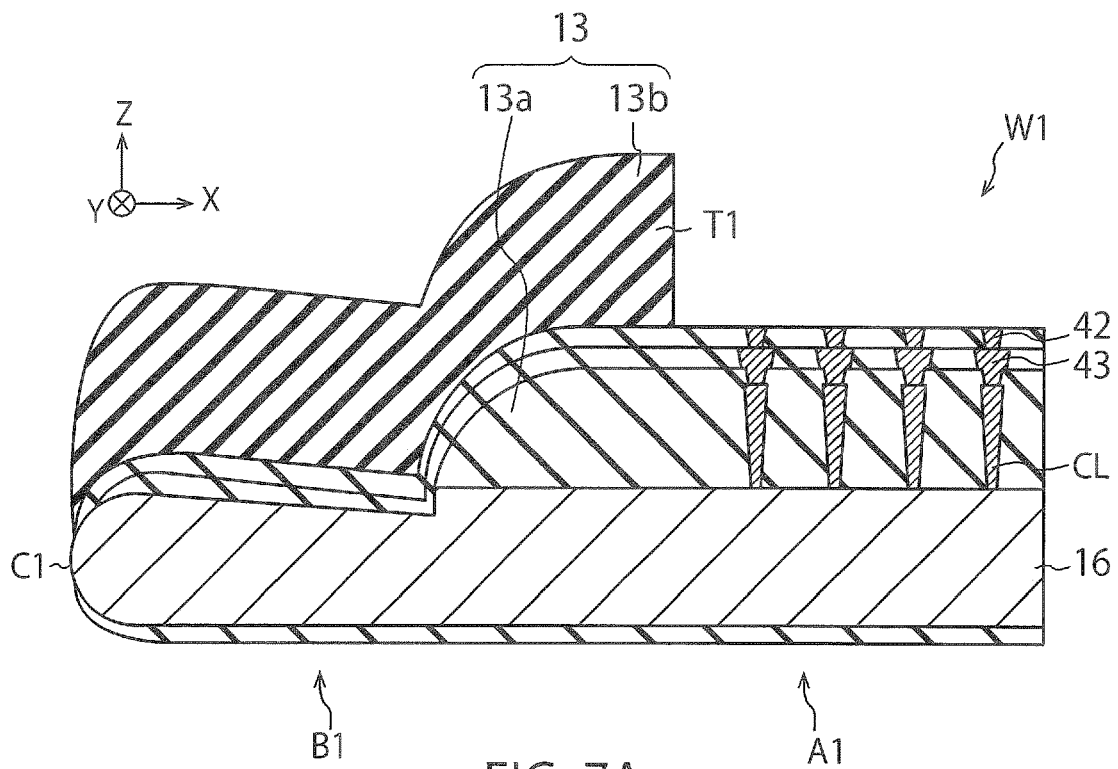

The method includes subsequently removing the resist film 17 (see FIG. 7A). The resist film 17 is removed by, for example, dry ashing. FIG. 7A illustrates the via plugs 42 exposed from the insulator 13b in the process of FIG. 6B.

Figure 7B:
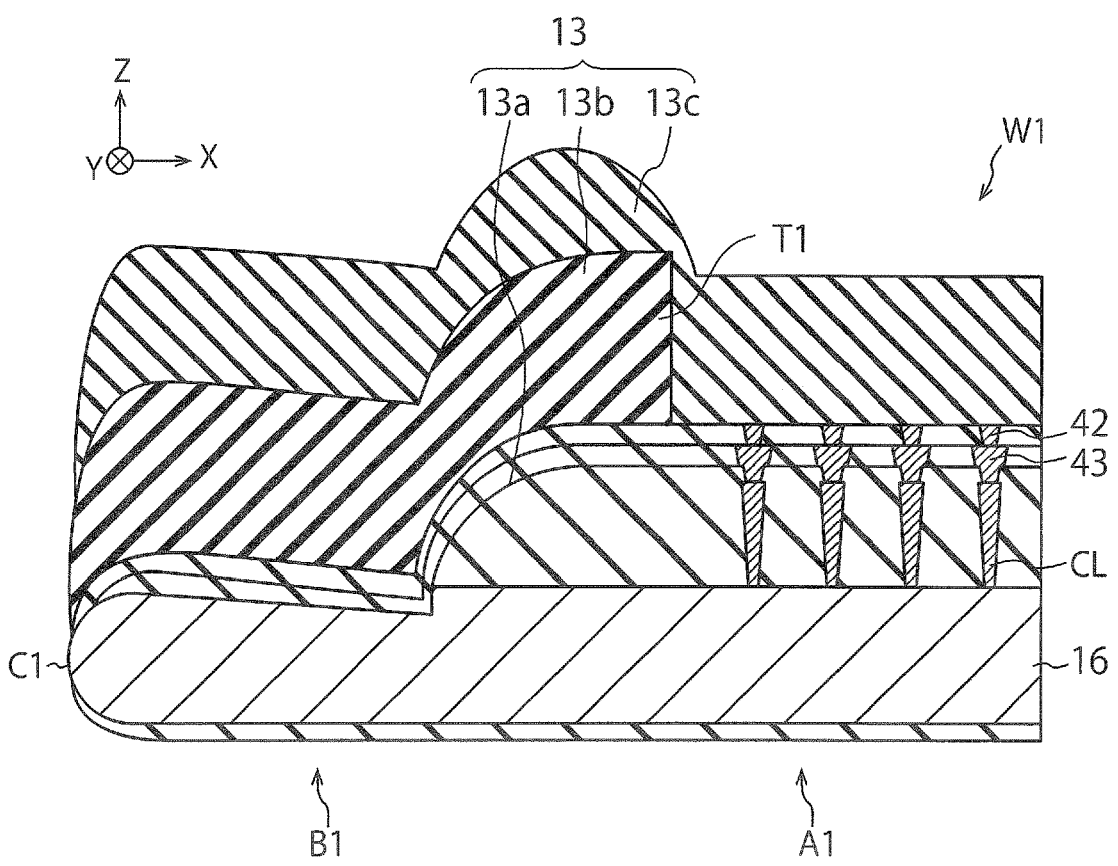

The method includes subsequently forming an insulator 13c that is a portion of the inter layer dielectric 13, via the insulator 13a and the insulator 13b, above the central portion A1 and the edge portion B1 of the substrate 16 (see FIG. 7B). As a result, the via plugs 42 are covered by the insulator 13c. Further, the insulator 13c partly protrudes from the protruding portion T1 of the insulator 13b. The insulator 13c of the present embodiment is an insulator formed of the same insulating material as the insulator 13b. Therefore, the insulator 13c is, for example, a dTEOS film. The thickness of the insulator 13c is, for example, 0.5 to 1.5 µm. The insulator 13c is an example of a third film.

Figure 8A:
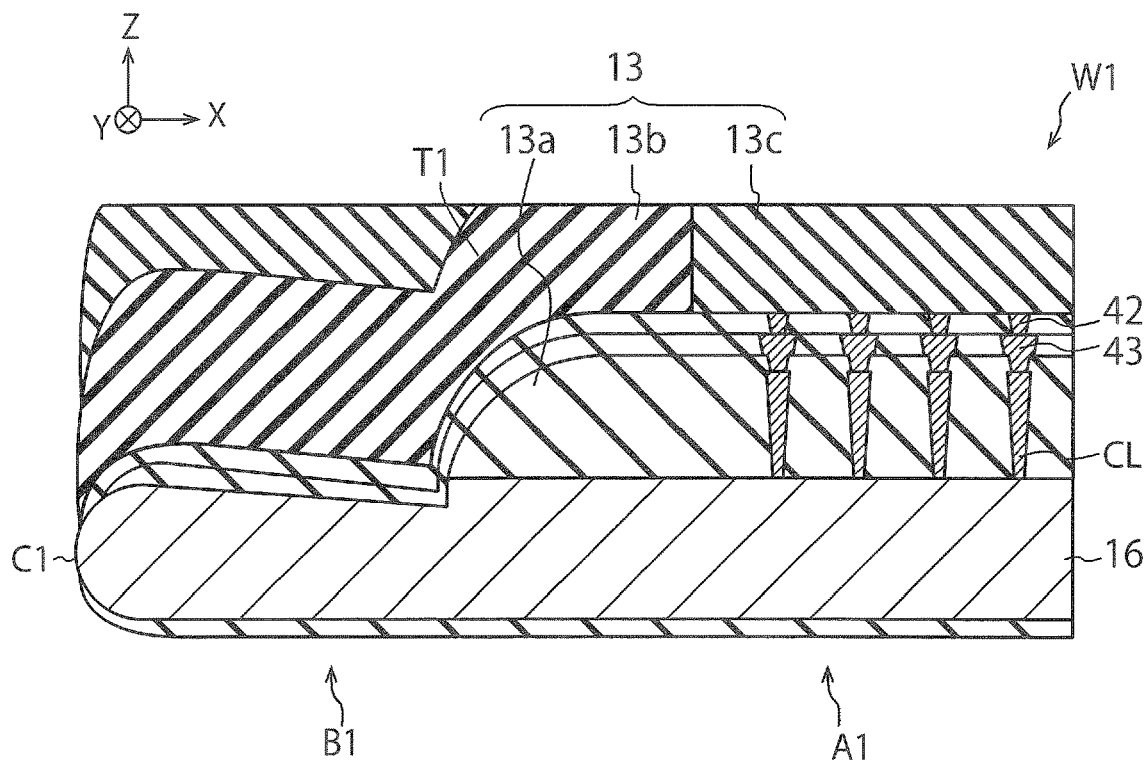

The method includes subsequently planarizing the upper faces of the insulators 13c and 13b by CMP (see FIG. 8A). As a result, the protrusion of the insulator 13c is eliminated, and the protruding portion T1 of the insulator 13b is exposed from the insulator 13c. As understood from FIG. 8A, the insulators 13b and 13c eliminate the above-mentioned difference in level. Note that the upper face of the inter layer dielectric 13 above the edge portion B1 has the same height as the upper face of the inter layer dielectric 13 above the central portion A1.

Figure 8B:
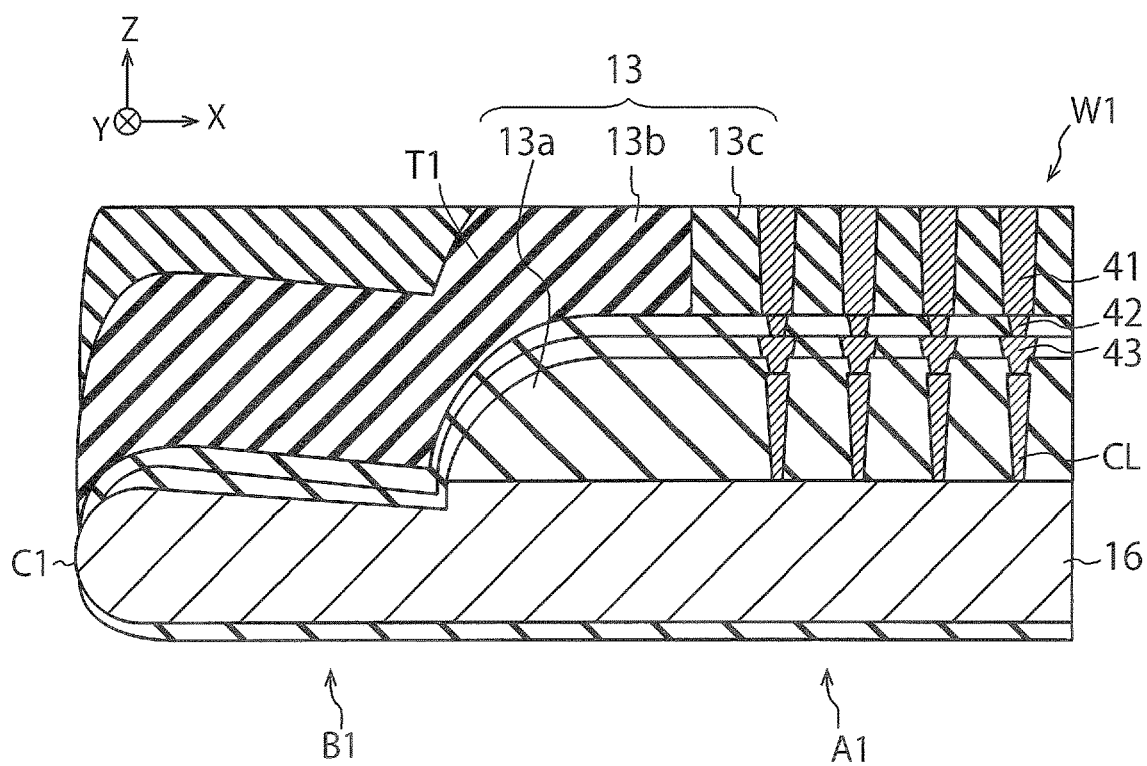

The method includes subsequently forming the metal pads 41 on the via plugs 42 in the inter layer dielectric 13 (see FIG. 8B). The metal pads 41 of the present embodiment are formed in the insulator 13c. In this manner, the array wafer W1 of the present embodiment is manufactured.

Figure 9:
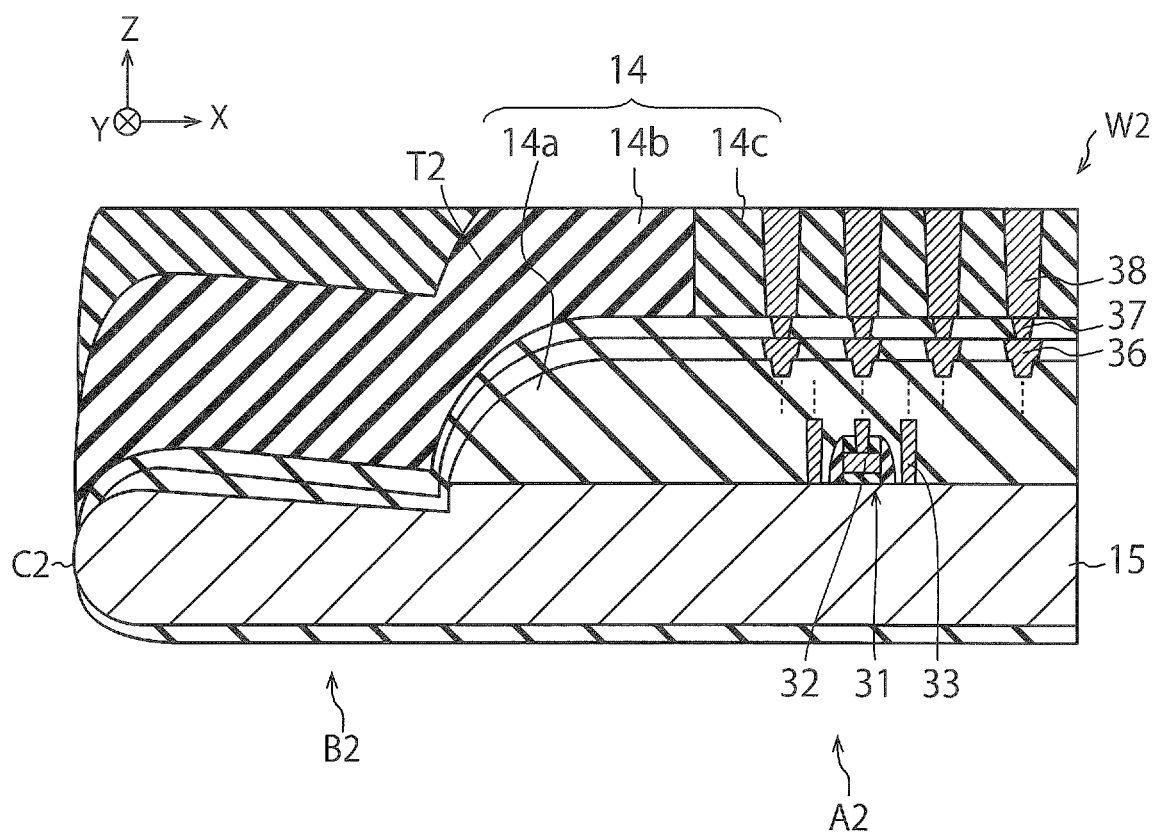
FIG. 9 is a cross-sectional view illustrating a method of manufacturing a circuit wafer W2 of the first embodiment.

FIG. 9 is a cross-sectional view illustrating a method of manufacturing the circuit wafer W2 of the first embodiment.

The circuit wafer W2 of the present embodiment can be manufactured, like the array wafer W1, through the processes from FIGS. 5A to 8B. FIG. 9 illustrates the circuit wafer W2 having been manufactured in this manner.

FIG. 9 illustrates the substrate 15, an insulator 14a that is a portion of the inter layer dielectric 14, the transistor 31 formed in the insulator 14a, the gate electrode 32, the plurality of contact plugs 33, the line layer 36, and the plurality of via plugs 37. However, the line layer 34 and the line layer 35 between the contact plugs 33 and the line layer 36 are not illustrated (see FIG. 3). The insulator 14a is an example of the first film. FIG. 9 further illustrates a central portion A2, an edge portion B2, and an outermost portion C2 of the substrate 15. FIG. 9 further illustrates an insulator 14b that is a portion of the inter layer dielectric 14, an insulator 14c that is a portion of the inter layer dielectric 14, a protruding portion T2 of the insulator 14b, and the plurality of metal pads 38 formed in the insulator 14c. The insulator 14b is an example of the second film, and the insulator 14c is an example of the third film. The substrate 15 illustrated in FIG. 9 is a semiconductor wafer before being diced and has a disk shape.

The materials and shapes of respective components of the circuit wafer W2 illustrated in FIG. 9 are similar to the materials and shapes of the components of the array wafer W1. For example, the insulators 14a, 14b, and 14c correspond to the insulators 13a, 13b, and 13c, respectively. Further, the central portion A2, the edge portion B2, and the outermost portion C2 of the substrate 15 correspond to the central portion A1, the edge portion B1, and the outermost portion C1 of the substrate 16, respectively. Further, the metal pads 38 and the via plugs 37 correspond to the metal pads 41 and the via plugs 42, respectively. Regarding examples of the materials and shapes of these components, refer to the description of the processes illustrated in FIGS. 5A to 8B.

In the present embodiment, the insulators 13b and 13c eliminate the difference in level of the insulator 13a, and the lower face of the inter layer dielectric 13 below the edge portion B1 has the same height as the lower face of the inter layer dielectric 13 below the central portion A1 (see FIG. 8B). Similarly, the insulators 14b and 14c eliminate the difference in level of the insulator 14a, and the upper face of the inter layer dielectric 14 above the edge portion B2 has the same height as the upper face of the inter layer dielectric 14 above the central portion A2 (see FIG. 9).

Figure 11:
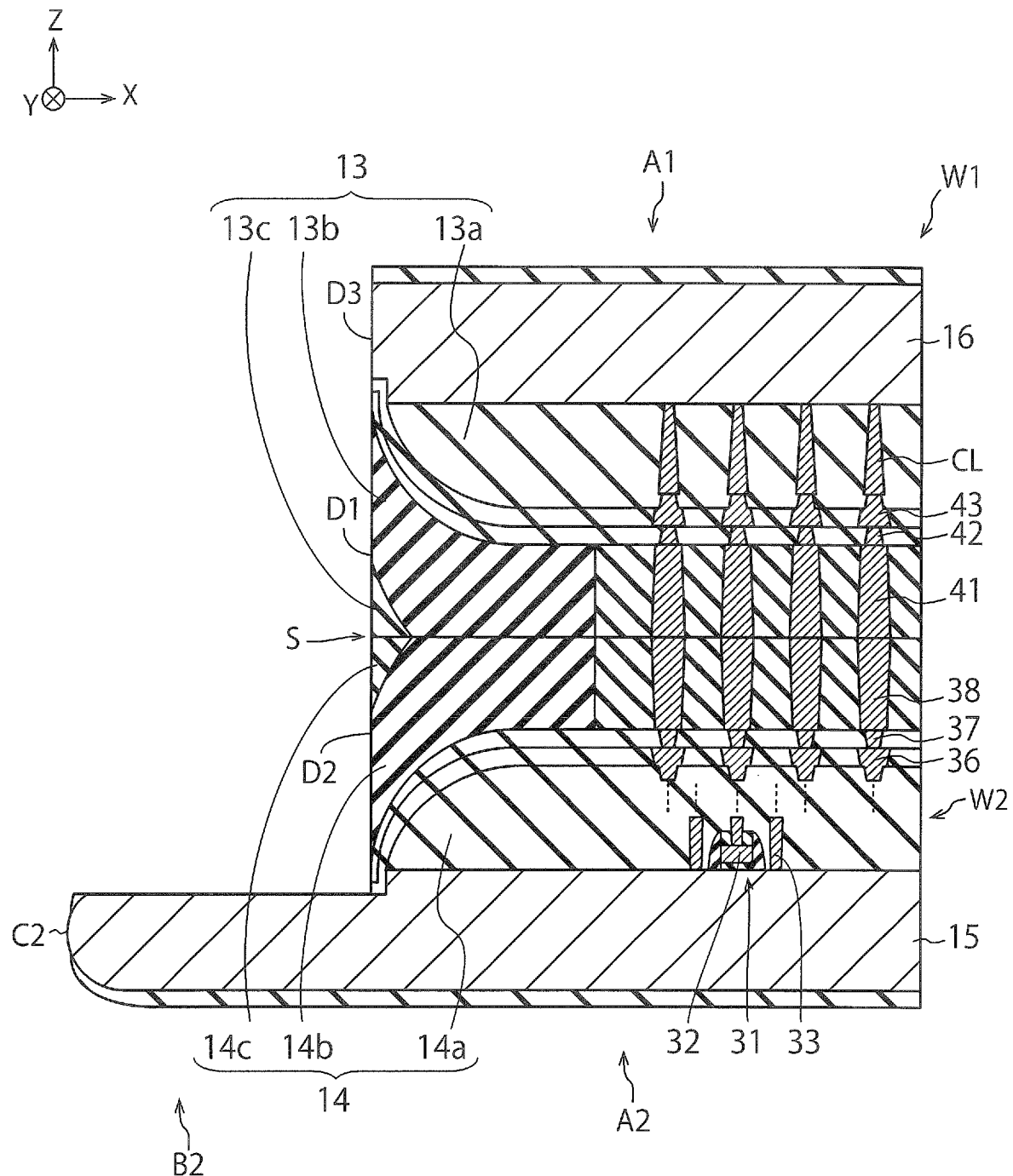

Therefore, the inter layer dielectric 13 and the inter layer dielectric 14 of the present embodiment are bonded together, as illustrated in FIG. 11 described below, so that the entire central portion A1 of the substrate 16 and the entire central portion A2 of the substrate 15 are in contact with each other. As described above, according to the present embodiment, it is possible to reduce the unbonded areas of the inter layer dielectrics 13 and 14, and it is possible to increase the effective chip areas of the array wafer W1 and the circuit wafer W2. This makes it possible to suppress wasteful disposal of the trimming portions of the array wafer W1 and the circuit wafer W2, and reduce wasteful disposal of the edge portions B1 and B2 of the substrates 16 and 15.

Figure 10:
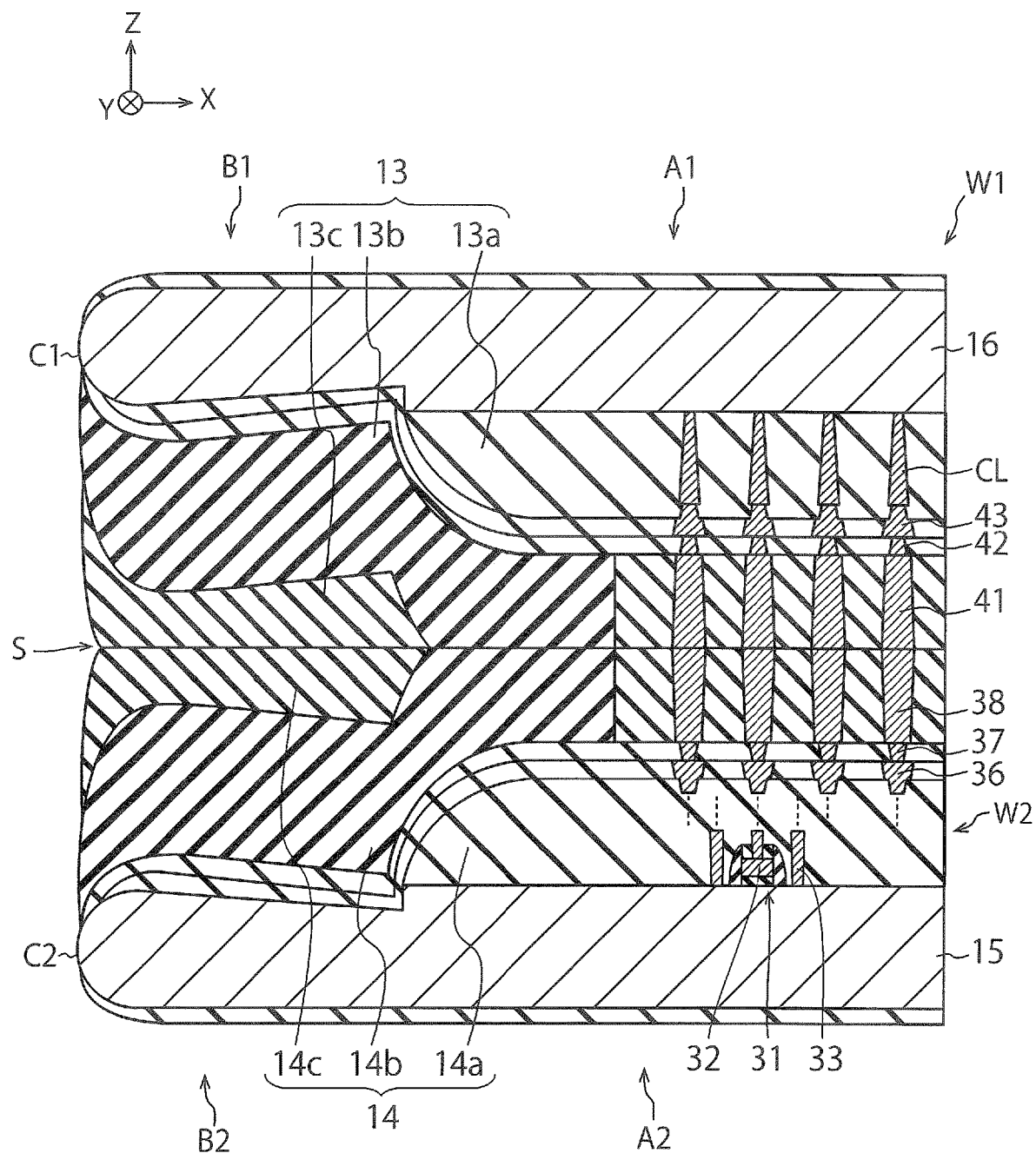
FIGS. 10 and 11 are cross-sectional views illustrating the method of manufacturing the semiconductor device of the first embodiment.

FIGS. 10 and 11 are cross-sectional views illustrating the method of manufacturing the semiconductor device of the first embodiment.

Similar to FIG. 4, FIG. 10 illustrates a process of bonding the array wafer W1 and the circuit wafer W2 together.

Therefore, the orientation of the array wafer W1 illustrated in FIG. 10 is opposite to the orientation of the array wafer W1 illustrated in FIGS. 5A to 8B. Accordingly, in FIG. 10, the upper face of the edge portion B1 of the substrate 16 is higher than the upper face of the central portion A1 of the substrate 16.

In the present embodiment, the insulators 13b and 13c eliminate the difference in level of the insulator 13a, and the lower face of the inter layer dielectric 13 below the edge portion B1 has the same height as the lower face of the inter layer dielectric 13 below the central portion A1. Similarly, the insulators 14b and 14c eliminate the difference in level of the insulator 14a, and the upper face of the inter layer dielectric 14 above the edge portion B2 has the same height as the upper face of the inter layer dielectric 14 above the central portion A2.

Therefore, the inter layer dielectric 13 and the inter layer dielectric 14 of the present embodiment are bonded together so as to be in contact with each other not only between the central portion A1 of the substrate 16 and the central portion A2 of the substrate 15 but also between the edge portion B1 of the substrate 16 and the edge portion B2 of the substrate 15. As mentioned above, according to the present embodiment, it is possible to reduce the unbonded areas of the inter layer dielectrics 13 and 14 and increase the effective chip areas of the array wafer W1 and the circuit wafer W2. This makes it possible to suppress wasteful disposal of the trimming portions of the array wafer W1 and the circuit wafer W2, and reduce wasteful disposal of the edge portions B1 and B2 of the substrates 16 and 15.

FIG. 10 illustrates the metal pads 38 and 41 that are bonded together. The metal pads 38 and 41 of the present embodiment are provided between the central portion A1 of the substrate 16 and the central portion A2 of the substrate 15, and are not provided between the edge portion B1 of the substrate 16 and the edge portion B2 of the substrate 15. Increasing the proportions of the central portions A1 and A2 and decreasing the proportions of the edge portions B1 and B2 can increase the effective chip areas of the array wafer W1 and the circuit wafer W2. The array wafer W1 and the circuit wafer W2 illustrated in FIG. 10 are subsequently subjected to trimming illustrated in FIG. 11 and cut into a plurality of chips as mentioned above.

FIG. 11 illustrates the array wafer W1 and the circuit wafer W2 after trimming. In the present embodiment, the trimming is performed to remove the inter layer dielectrics 13 and 14 between the edge portions B1 and B2 of the substrates 16 and 15. At this time, the edge portion B1 of the substrate 16 and a portion of the edge portion B2 of the substrate 15 are removed by the trimming.

FIG. 11 illustrates an edge face D1 of the trimmed inter layer dielectric 13, an edge face D2 of the trimmed inter layer dielectric 14, and an edge face D3 of the trimmed substrate 16. The edge faces D1, D2, and D3 are trimming faces formed by trimming on the inter layer dielectric 13, the inter layer dielectric 14, and the substrate 16, respectively. Since the inter layer dielectric 13, the inter layer dielectric 14, and the substrate 16 are trimmed in the same trimming process, the edge face D1 is vertically extending above and continuous to the edge face D2 and the edge face D3 is vertically extending above and continuous to the edge face D1. The inter layer dielectric 13 and the inter layer dielectric 14 of the present embodiment are connected to each other between the edge face D1 of the inter layer dielectric 13 and the edge face D2 of the inter layer dielectric 14.

As mentioned above, the inter layer dielectric 13 and the inter layer dielectric 14 of the present embodiment are bonded together so as to be in contact with each other not only between the central portion A1 of the substrate 16 and the central portion A2 of the substrate 15 but also between the edge portion B1 of the substrate 16 and the edge portion B2 of the substrate 15 (see FIG. 10). Therefore, in the present embodiment, by trimming almost only the inter layer dielectrics 13 and 14 between the edge portions B1 and B2, all of the unbonded areas can be removed. This makes it possible to suppress wasteful disposal of many trimming portions. In FIG. 11, trimmed and removed are almost only the inter layer dielectrics 13 and 14 between the edge portions B1 and B2, of the inter layer dielectrics 13 and 14 between the central portions A1 and A2 and between the edge portions B1 and B2. The array wafer W1 and the circuit wafer W2 illustrated in FIG. 11 are, subsequently, cut into a plurality of chips, as mentioned above. At this time, the substrate 15 (substantially the edge portion B2 of the substrate 15) under the trimming portion is discarded. In the trimming of the present embodiment, the inter layer dielectrics 13 and 14 on the central portions A1 and A2 may be partly removed, or the inter layer dielectrics 13 and 14 on the edge portions B1 and B2 may be partly left.

As mentioned above, the inter layer dielectric 13 and the inter layer dielectric 14 of the present embodiment are in contact with each other not only between the central portion A1 of the substrate 16 and the central portion A2 of the substrate 15 but also between the edge portion B1 of the substrate 16 and the edge portion B2 of the substrate 15, as illustrated in FIG. 10. Therefore, according to the present embodiment, it is possible to reduce wasteful disposal of the edge portions B1 and B2 or the like of the substrates 16 and 15. For example, of the present embodiment, the inter layer dielectrics 13 and 14 to be removed by trimming can be limited to almost only the inter layer dielectrics 13 and 14 between the edge portions B1 and B2, and the inter layer dielectrics 13 and 14 between the central portions A1 and A2 can be almost left after trimming. Further, according to the present embodiment, the substrate 16 to be removed by trimming can be limited to almost only the edge portion B1 of the substrate 16, and the central portion A1 of the substrate 16 can be almost left after trimming. In this case, the substrate 15 discarded due to trimming can be limited almost only the edge portion B2 of the substrate 15.

Second Embodiment

Hereinafter, a method of manufacturing the semiconductor device of the second embodiment will be described with reference to FIGS. 12A to 23. In executing the method illustrated in FIGS. 3 and 4, the method illustrated in FIGS. 12A to 23 adopts processes different from those of the method illustrated in FIGS. 5A to 11.

FIGS. 12A to 21B are cross-sectional views illustrating a method of manufacturing an array wafer W1 (and a circuit wafer W2) of the second embodiment.

Figure 12A:
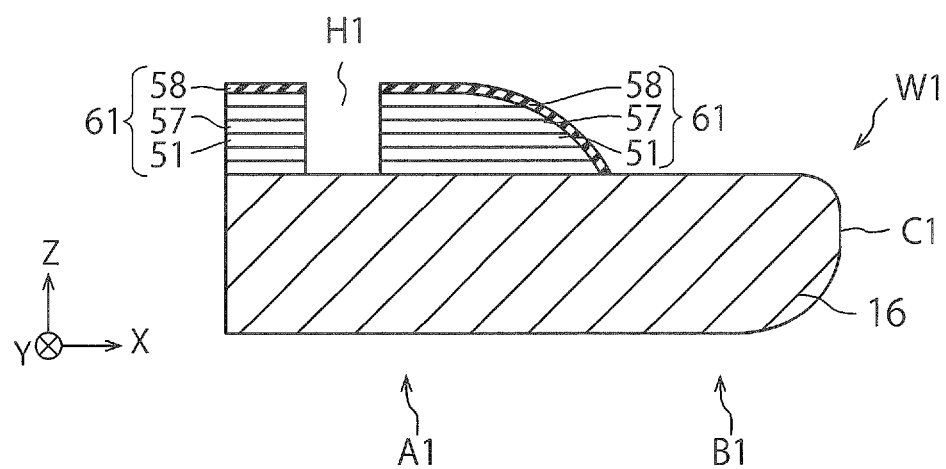
FIGS. 12A to 20B are cross-sectional views illustrating a method of manufacturing the array wafer W1 of a second embodiment.

The method includes, first, forming a stacked film 61 on the substrate 16, to form a portion of the memory cell array 11 (see FIG. 12A). The stacked film 61 includes a plurality of insulating layers 51 and a plurality of insulating layers 57 that are alternately formed on the substrate 16, and a cover insulator 58 is formed so as to cover the surfaces of the insulating layers 51 and the insulating layers 57. The insulating layer 51 is, for example, a silicon oxide film. The insulating layer 57 is, for example, a silicon nitride film. The cover insulator 58 is, for example, a silicon oxide film. The insulating layer 51 is an example of a first insulating layer, and the insulating layer 57 is an example of a second insulating layer. The method includes subsequently forming a peripheral aperture H1 penetrating the stacked film 61 (see FIG. 12A). The insulator 12 and the source layer SL on the substrate 16 are not illustrated (see FIG. 3).

The substrate 16 illustrated in FIG. 12A is a semiconductor wafer before being diced and has a disk shape. Similar to FIG. 5A, FIG. 12A further illustrates a central portion A1, an edge portion B1, and an outermost portion C1 of the substrate 16. The central portion A1 is a region on the central axis side of the substrate 16, and the edge portion B1 is a region on the outermost portion C1 side of the substrate 16. The edge portion B1 of the present embodiment has an annular (ring-like) shape surrounding the central portion A1. Even in the present embodiment, the upper face of the edge portion B1 of the substrate 16 may be lower than the upper face of the central portion A1 of the substrate 16.

The stacked film 61 is formed, for example, by the following method. The method includes, first, alternately forming the plurality of insulating layers 51 and the plurality of insulating layers 57 on the substrate 16. The method includes subsequently processing the insulating layers 51 and the insulating layers 57 partly into a stairway shape, as illustrated in FIG. 12A. FIG. 12A illustrates surfaces of the insulating layers 51 and the insulating layers 57 that are inclined in the vicinity of the edge portion B1. The method includes subsequently forming the cover insulator 58 on the insulating layers 51 and the insulating layers 57. Subsequently, the peripheral aperture H1 is formed in the stacked film 61 in the vicinity of the edge portion B1. The thickness of the stacked film 61 is, for example, approximately 3 µm. The stacked film 61 is an example of a first stacked film.

Figure 12B:
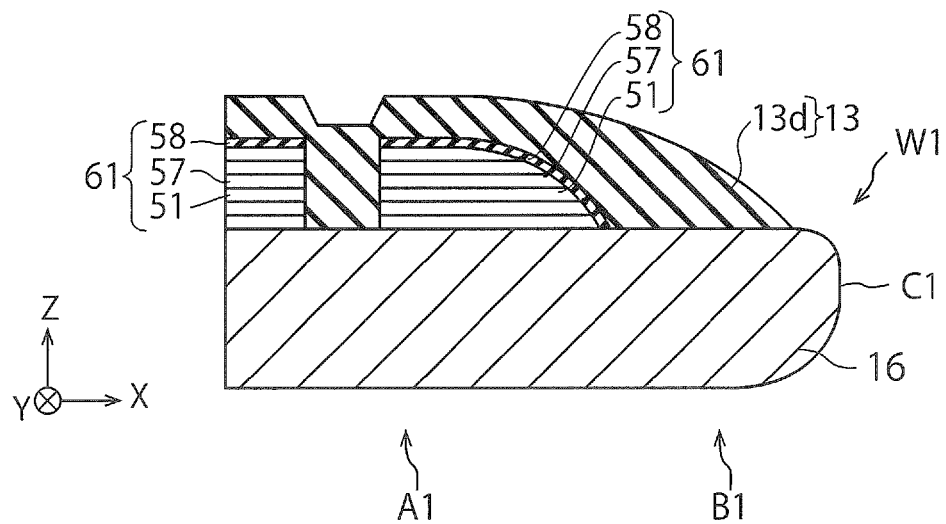

The method includes subsequently forming, on the substrate 16, an insulator 13d that is a portion of the inter layer dielectric 13, via the stacked film 61 (see FIG. 12B). The insulator 13d is, for example, a dTEOS film. The insulator 13d of the present embodiment is formed such that the peripheral aperture H1 is filled with the insulator 13d. Further, the insulator 13d of the present embodiment is formed not only on the central portion A1 but also on the edge portion B1.

Figure 13A:
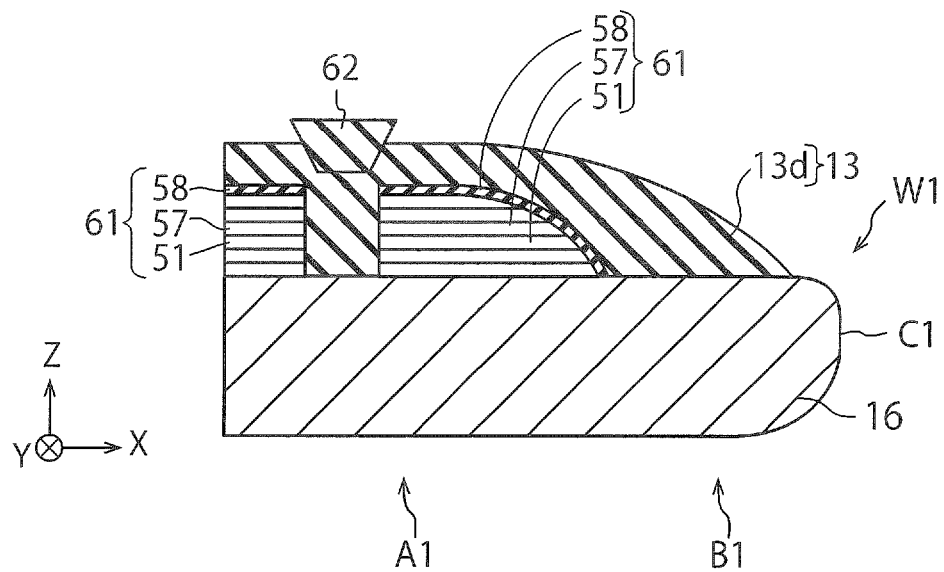

The method includes subsequently forming a resist film 62, by lithography and etching, on the insulator 13d above the peripheral aperture H1 (see FIG. 13A).

Figure 13B:
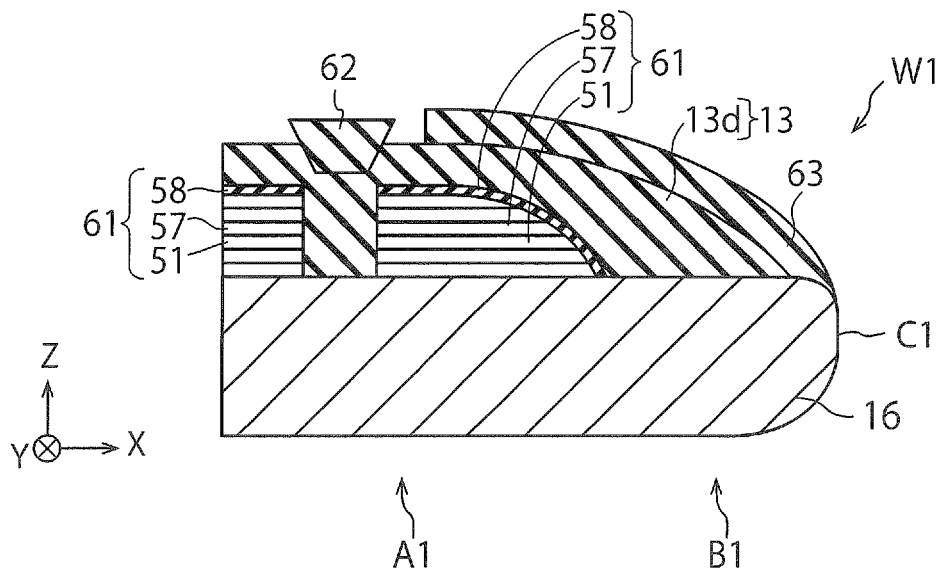

The method includes subsequently forming a resist film 63, by lithography and etching, on the insulator 13d above the edge portion B1 (see FIG. 13B). The resist film 63 of the present embodiment is also formed on the insulator 13d above the central portion A1 in the vicinity of the edge portion B1. As illustrated in FIG. 13B, the resist film 63 covers the stairway portion of the stacked film 61.

Figure 14A:
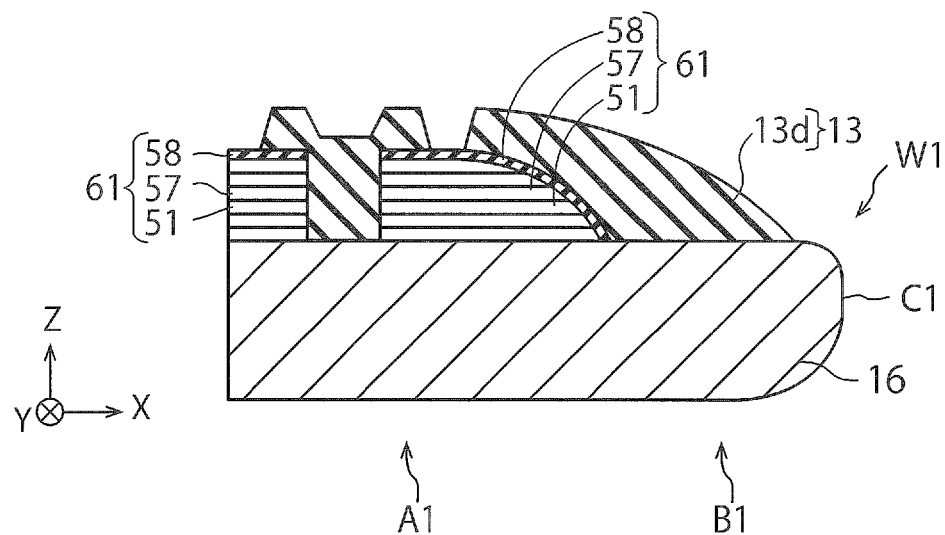

The method includes subsequently removing a portion of the insulator 13d by etching using the resist films 62 and 63 as a mask (see FIG. 14A). As a result, the insulator 13d remains in the peripheral aperture H1, in the vicinity of the peripheral aperture H1, on the edge portion B1, and on the central portion A1 in the vicinity of the edge portion B1. The method includes subsequently removing the resist films 62 and 63 (see FIG. 14A).

Figure 14B:
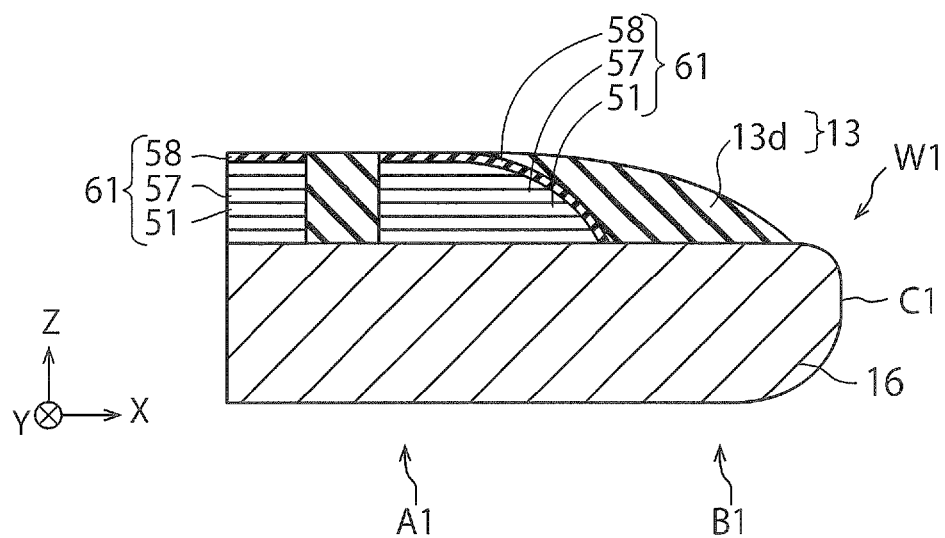

The method includes subsequently planarizing the surface of the insulator 13d by CMP (see FIG. 14B). As a result, the insulator 13d remaining in the vicinity of the peripheral aperture H1 is removed. Note that, in the present embodiment, the insulator 13d remains on the edge portion B1.

The method includes subsequently performing processes illustrated in FIGS. 15A to 17B that are similar to the processes illustrated in FIGS. 12A to 14B.

Figure 15A:
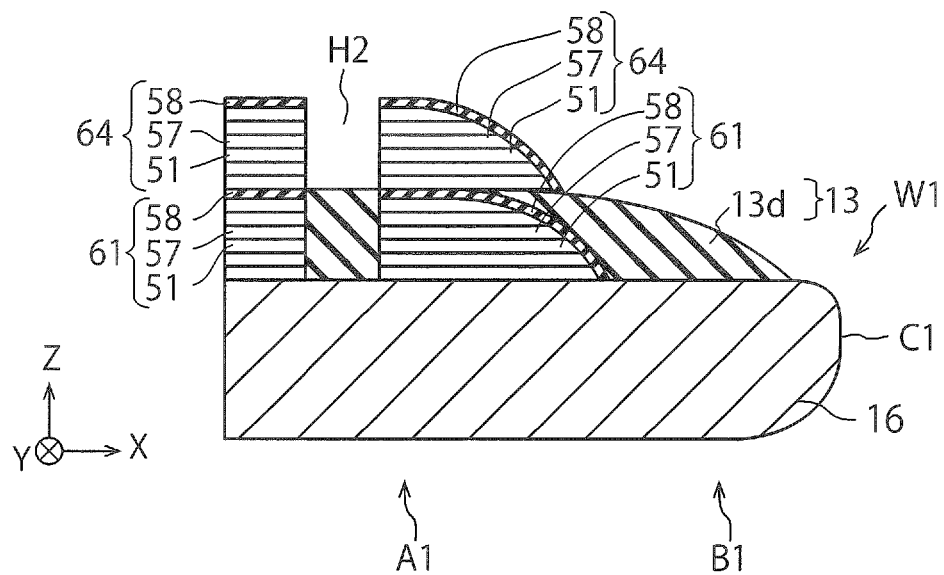

The method includes, first, forming a stacked film 64 on the substrate 16, via the stacked film 61 and the insulator 13d, to form another portion of the memory cell array 11 (see FIG. 15A). Similar to the stacked film 61, the stacked film 64 includes a plurality of insulating layers 51 and a plurality of insulating layers 57 alternately formed on the substrate 16, and a cover insulator 58 formed so as to cover the surfaces of the insulating layers 51 and the insulating layers 57. The method includes subsequently forming a peripheral aperture H2 that penetrates the stacked film 64 (see FIG. 15A). The peripheral aperture H2 is formed on the peripheral aperture H1.

The stacked film 64 is formed, for example, by the following method. The method includes, first, alternately forming the plurality of insulating layers 51 and the plurality of insulating layers 57 on the substrate 16. The method includes subsequently processing the insulating layers 51 and the insulating layers 57 partly into a stairway shape, as illustrated in FIG. 15A. FIG. 15A illustrates surfaces of the insulating layers 51 and the insulating layers 57 that are inclined in the vicinity of the edge portion B1. The method includes subsequently forming the cover insulator 58 on the insulating layers 51 and the insulating layers 57. Subsequently, the peripheral aperture H2 is formed in the stacked film 64 in the vicinity of the edge portion B1. The thickness of the stacked film 64 is, for example, approximately 3 µm. The stacked film 64 is an example of a second stacked film.

In the present embodiment, the tip of the stairway portion of the stacked film 64 is positioned on the central axis side of the substrate 16, compared to the tip of the stairway portion of the stacked film 61. In other words, in FIG. 15A, the right end of the stairway portion of the stacked film 64 is positioned on the left side of the right end of the stairway portion of the stacked film 61. The stacked films 61 and 64 of the present embodiment are formed to have such shapes.

Figure 15B:
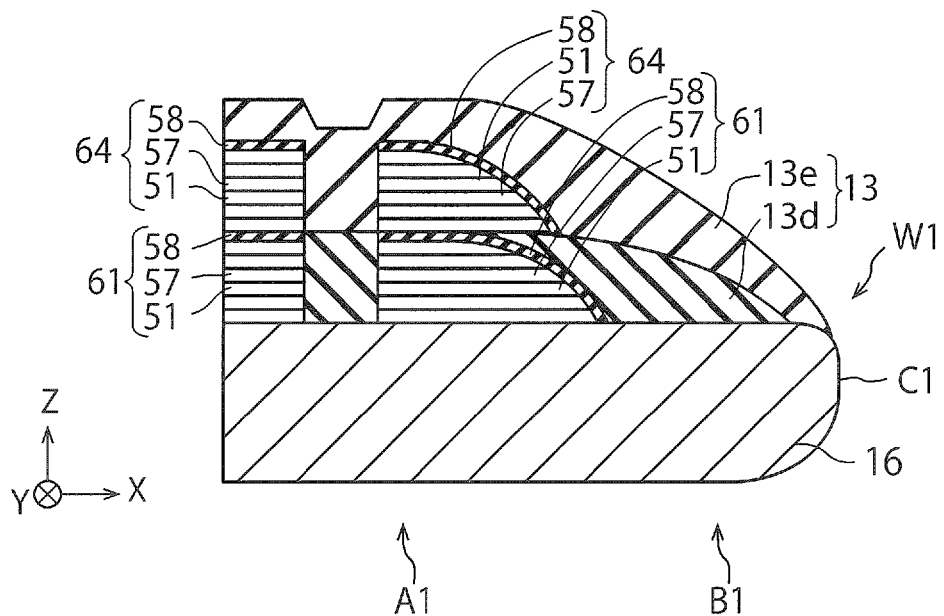

The method includes subsequently forming an insulator 13e that is another portion of the inter layer dielectric 13, on the substrate 16, via the stacked films 61 and 64 and the insulator 13d (see FIG. 15B). The insulator 13e is, for example, a dTEOS film. The insulator 13e of the present embodiment is formed such that the peripheral aperture H2 is filled with the insulator 13e. Further, the insulator 13e of the present embodiment is formed not only on the central portion A1 but also on the edge portion B1.

Figure 16A:
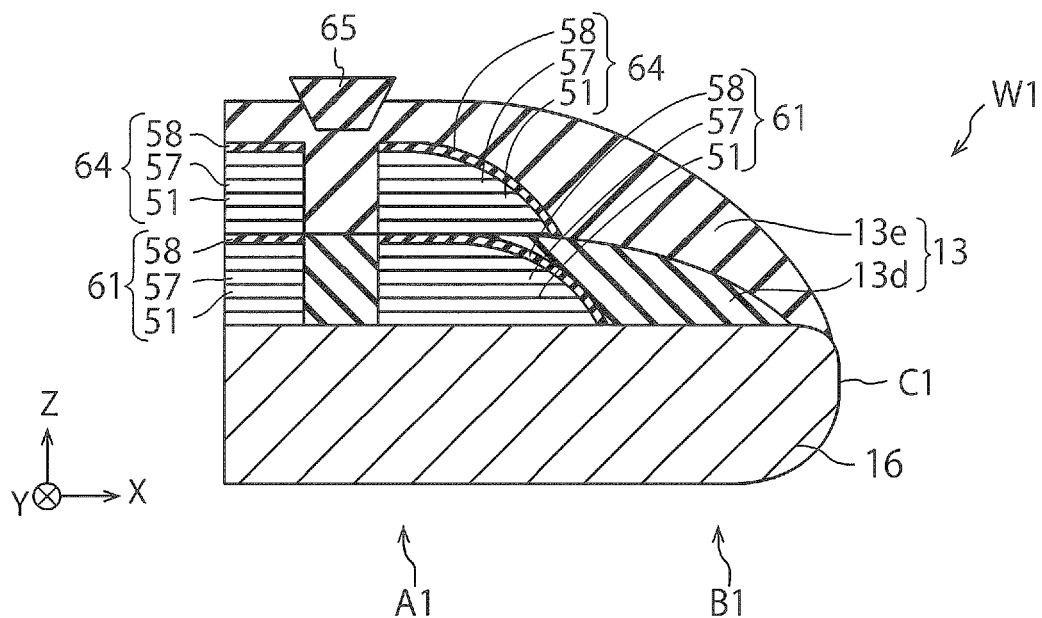

The method includes subsequently forming a resist film 65, by lithography and etching, on the insulator 13e above the peripheral aperture H2 (see FIG. 16A).

Figure 16B:
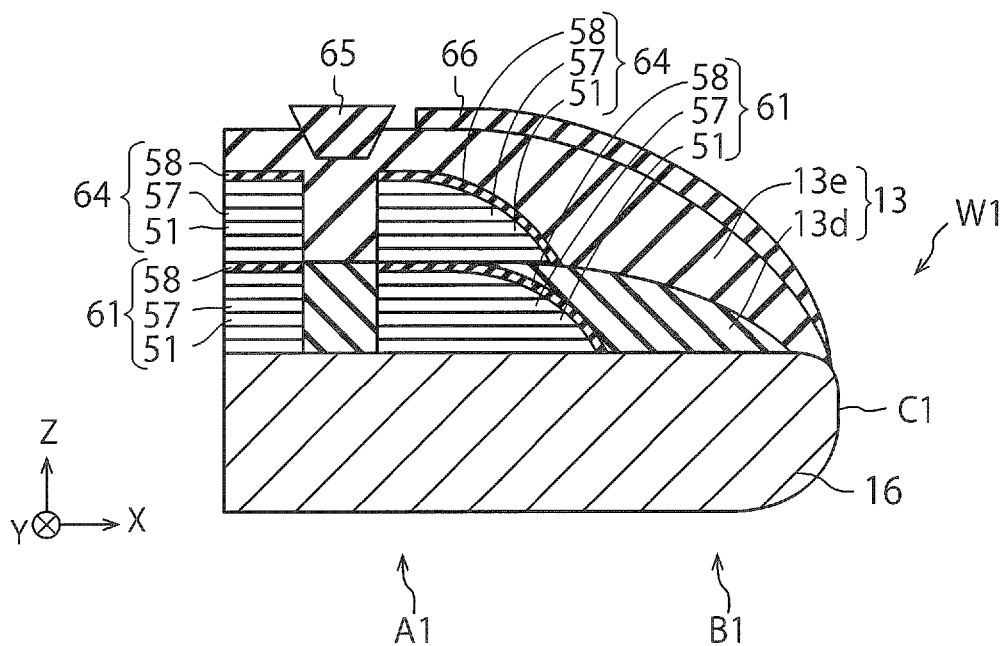

The method includes subsequently forming a resist film 66, by lithography and etching, on the insulator 13e above the edge portion B1 (see FIG. 16B). The resist film 66 of the present embodiment is also formed on the insulator 13e above the central portion A1 in the vicinity of the edge portion B1. As illustrated in FIG. 16B, the resist film 66 covers the stairway portion of the stacked film 64.

Figure 17A:
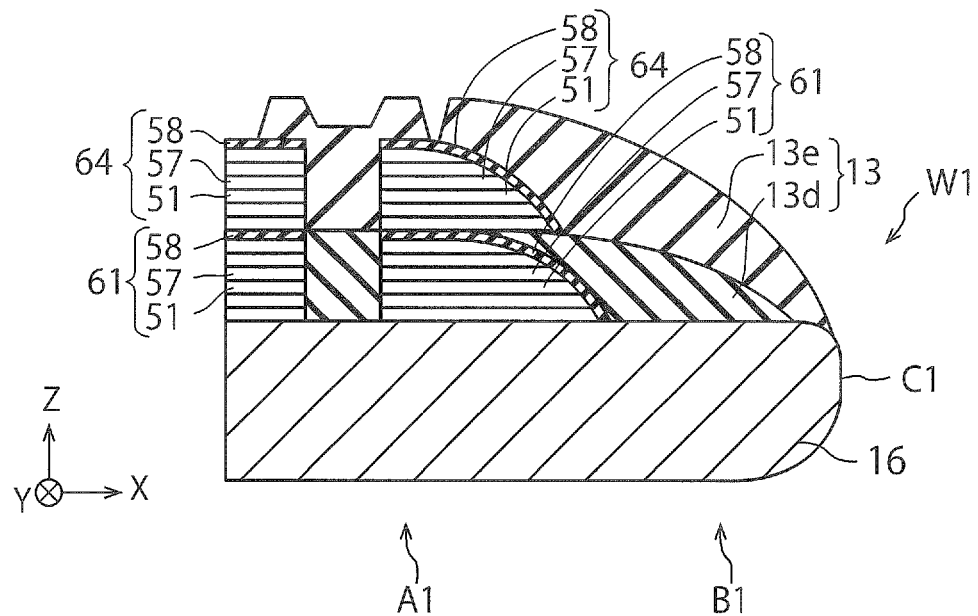

The method includes subsequently removing a portion of the insulator 13e by etching using the resist films 65 and 66 as a mask (see FIG. 17A). As a result, the insulator 13e remains in the peripheral aperture H2, in the vicinity of the peripheral aperture H2, on the edge portion B1, and on the central portion A1 in the vicinity of the edge portion B1. The method includes subsequently removing the resist films 65 and 66 (see FIG. 17A).

Figure 17B:
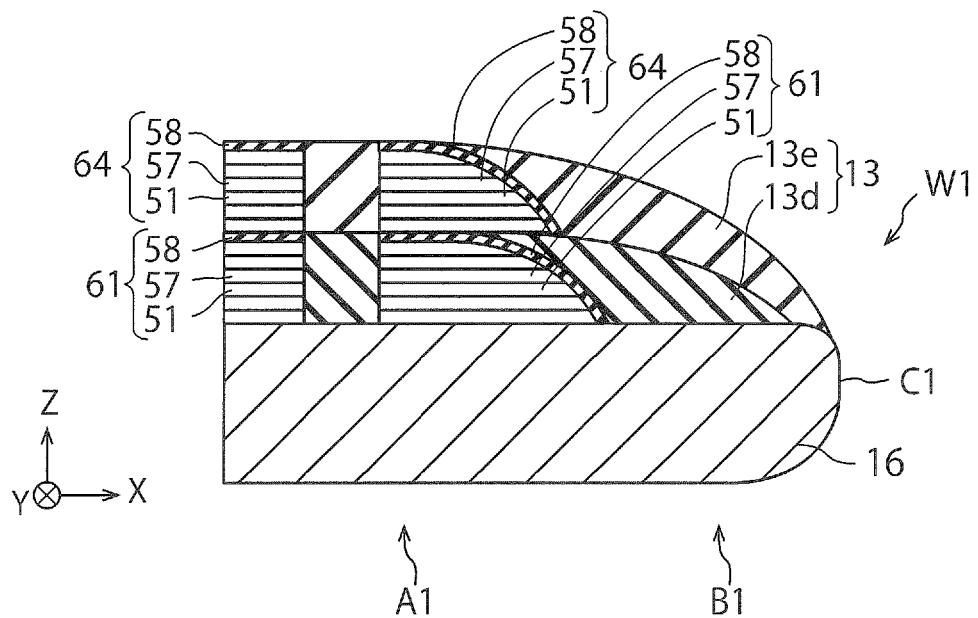

The method includes subsequently planarizing the surface of the insulator 13e by CMP (see FIG. 17B). As a result, the insulator 13e remaining in the vicinity of the peripheral aperture H2 is removed. Note that, in the present embodiment, the insulator 13e remains on the edge portion B1. Further, note that in the present embodiment, a portion of the insulator 13d intervenes between the stairway portion of the stacked film 61 and the stairway portion of the stacked film 64.

Figure 18A:
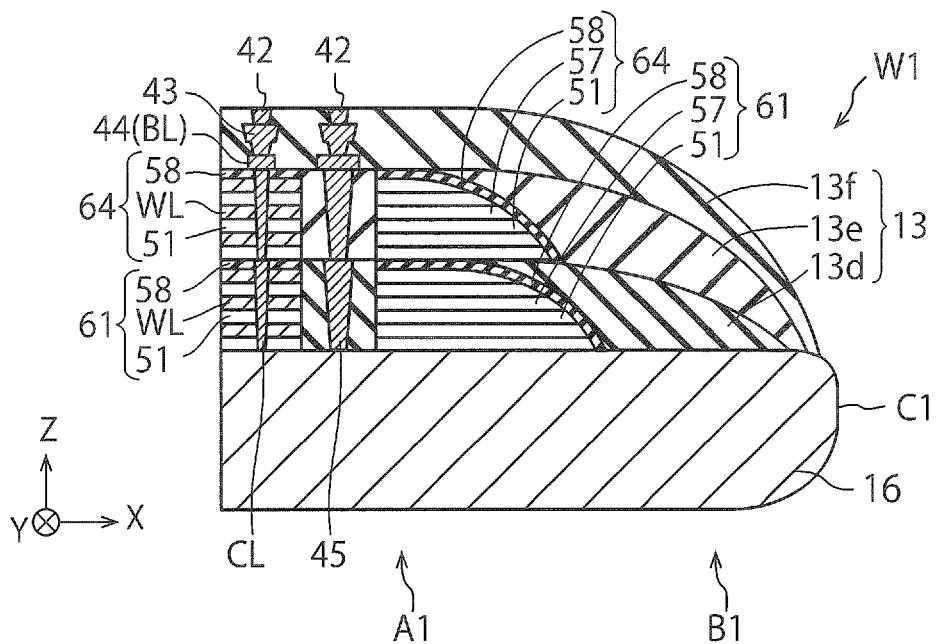

The method includes subsequently executing a replacement process for replacing portions of the insulating layers 57 by the word lines WL (see FIG. 18A). The replacement process is performed, for example, by the following method. The method includes, first, forming slits (not illustrated) that penetrate the stacked films 61 and 64 and removing the insulating layers 57 by wet etching using these slits. As a result, cavities are formed between mutually neighboring insulating layers 51. The method includes subsequently filling the cavities with the material of the word lines WL. As a result, the stacked films 61 and 64 are changed so as to include the plurality of insulating layers 51 and the plurality of word lines WL that are alternately arranged. However, when removing the insulating layers 57, the insulating layers 57 of the stairway portion illustrated in FIG. 18A remains, although the insulating layers 57 other than the stairway portion illustrated in FIG. 18A are removed. Therefore, the stairway portion illustrated in FIG. 18A still includes the plurality of insulating layers 51 and the plurality of insulating layers 57 that are alternately arranged. Since the word lines WL are formed by partly removing the insulating layers 57 in this manner, the formed word lines WL have the same heights as the remaining insulating layers 57. The word line WL is an example of the electrode layer.

The method includes subsequently forming via plugs 45 in the insulators 13d and 13e in the peripheral apertures H1 and H2, and forming columnar portions CL in the stacked films 61 and 64 including the word lines WL (see FIG. 18A).

The method includes subsequently forming an insulator 13f that is another portion of the inter layer dielectric 13, on the substrate 16, via the stacked films 61 and 64 and the insulators 13d and 13e (see FIG. 18A). The insulator 13f is, for example, a dTEOS film. The insulator 13f of the present embodiment is formed not only on the central portion A1 but also on the edge portion B1.

The method includes subsequently forming a plurality of via plugs 42 in the insulator 13f (see FIG. 18A). FIG. 18A exemplary illustrates one via plug 42 electrically connected to the via plugs 45 via the line layers 44 and 43 and another via plug 42 electrically connected to the columnar portions CL via the line layers 44 and 43. In the present embodiment, the line layers 44 and 43 are formed before these via plugs 42 are formed. The line layer 44 between the columnar portion CL and the via plug 42 corresponds to the bit line BL. The via plug 24 between the columnar portion CL and the line layer 43 is not illustrated (see FIG. 3).

Figure 18B:
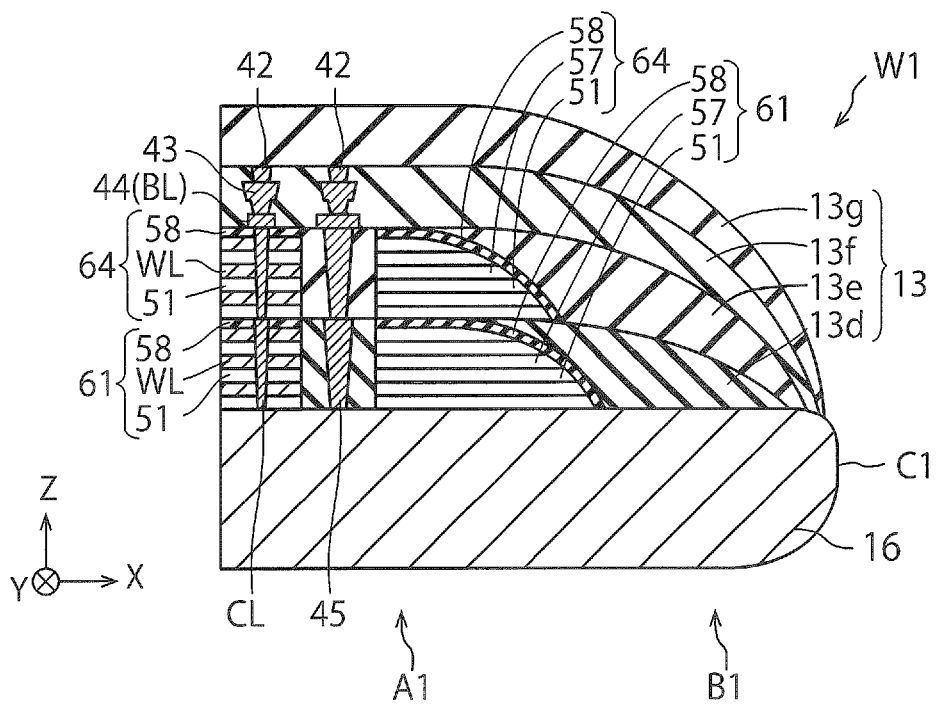

The method includes subsequently forming an insulator 13g that is another portion of the inter layer dielectric 13, on the insulator 13f, so as to cover these via plugs 42 (see FIG. 18B). The insulator 13g is, for example, a dTEOS film. The insulator 13g of the present embodiment is formed not only on the central portion A1 but also on the edge portion B1.

Figure 19A:
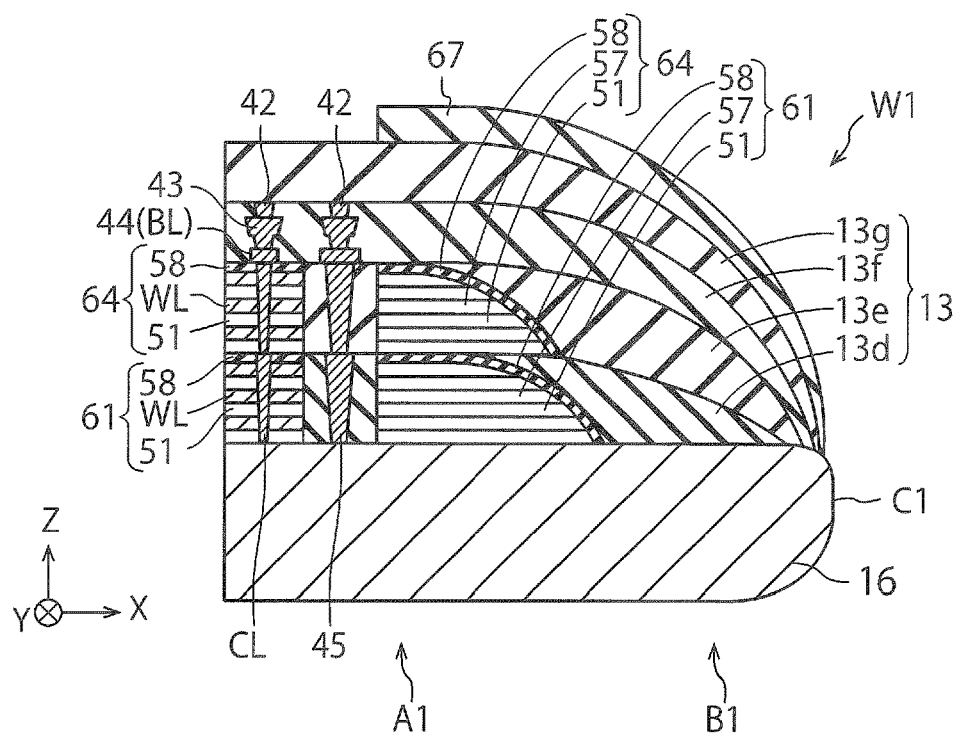
Figure 19B:
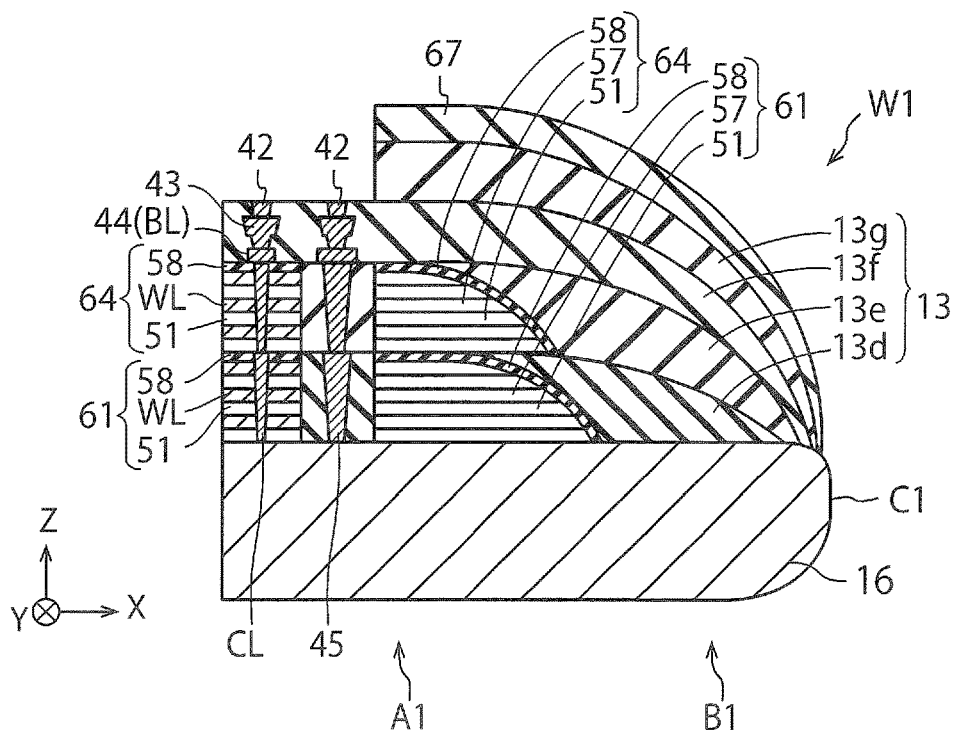

The method includes subsequently forming a resist film 67, by lithography and etching, on the insulator 13g above the edge portion B1 (see FIG. 19A). The resist film 67 of the present embodiment is also formed on the insulator 13g above the central portion A1 in the vicinity of the edge portion B1. As illustrated in FIG. 19A, the resist film 66 covers the insulator 13g above the stairway portion of the stacked film 64. The method includes subsequently removing a portion of the insulator 13g by etching using the resist film 67 as a mask (see FIG. 19B). As a result, the insulator 13g remains on the edge portion B1, and on the central portion A1 in the vicinity of the edge portion B1. FIG. 19B illustrates the via plugs 42 exposed from the insulator 13g.

Figure 20A:
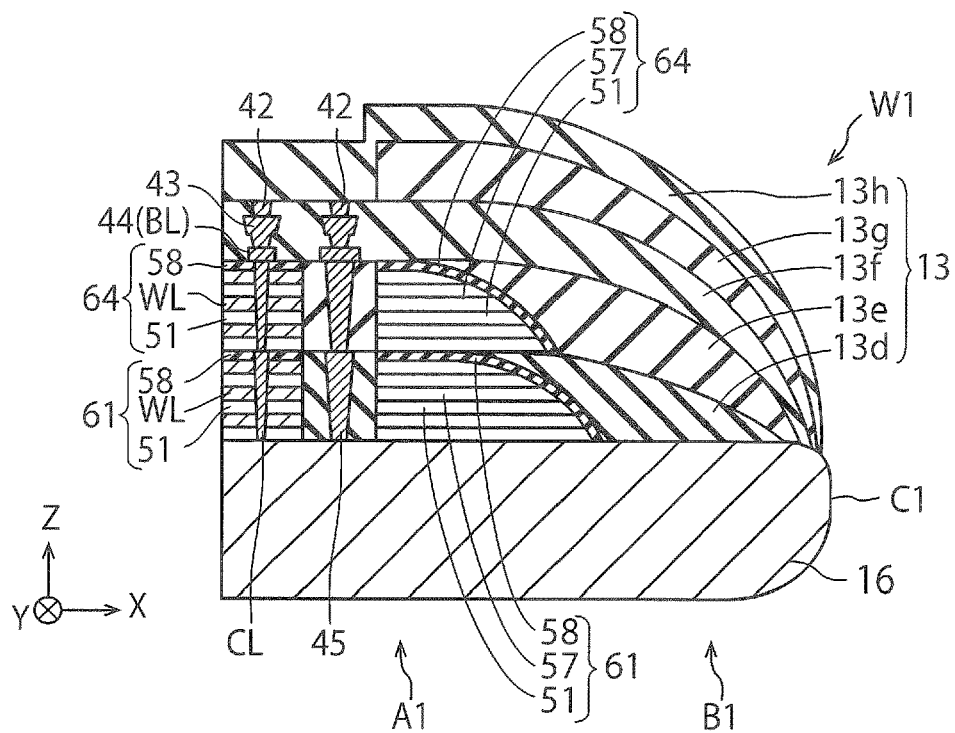

The method includes subsequently removing the resist film 67 and then forming an insulator 13h that is another portion of the inter layer dielectric 13, on the insulators 13f and 13g, so as to cover these via plugs 42 (see FIG. 20A). The insulator 13h is, for example, a dTEOS film. The insulator 13h of the present embodiment is formed not only on the central portion A1 but also on the edge portion B1. The thickness of the insulator 13h of the present embodiment is substantially the same as the thickness of the insulator 13g. FIG. 20A illustrates a portion different in level formed between the insulator 13h directly formed on the upper face of the insulator 13f and the insulator 13h directly formed on the upper face of the insulator 13g.

Figure 20B:
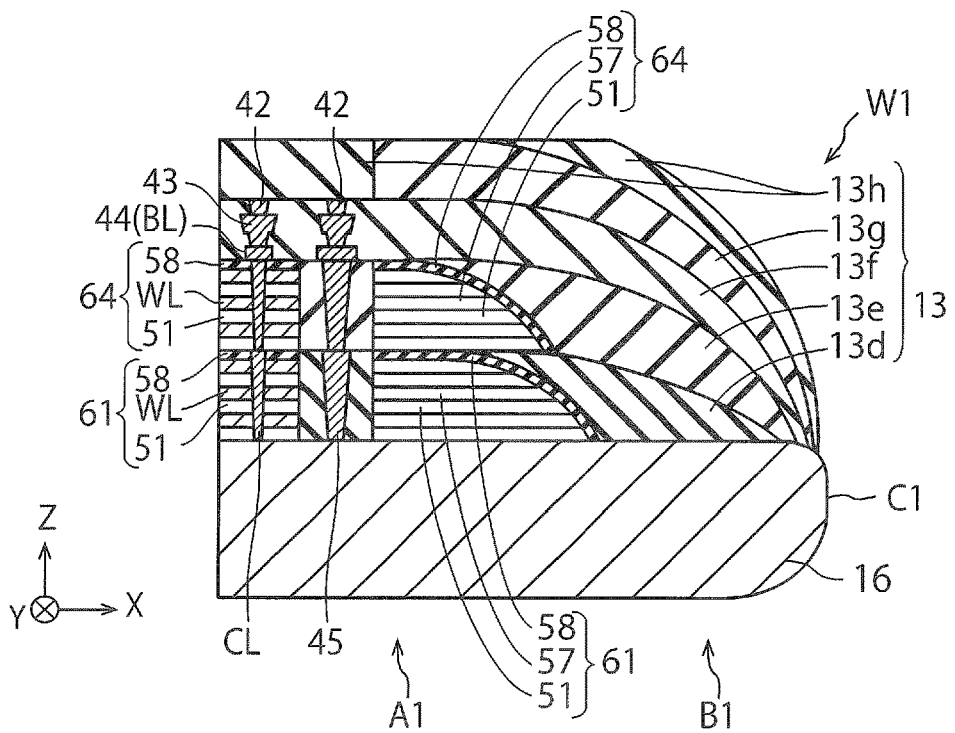

The method includes subsequently planarizing the surface of the insulator 13h by CMP (see FIG. 20B). As a result, the insulator 13h directly formed on the upper face of the insulator 13g is partly removed in the vicinity of the portion different in level. Note that, in the present embodiment, the insulator 13g and the like remain on the edge portion B1. Further, note that in FIG. 20B, the upper face of the inter layer dielectric 13 above the edge portion B1 has the same height as the upper face of the inter layer dielectric 13 above the central portion A1.

Figure 21A:
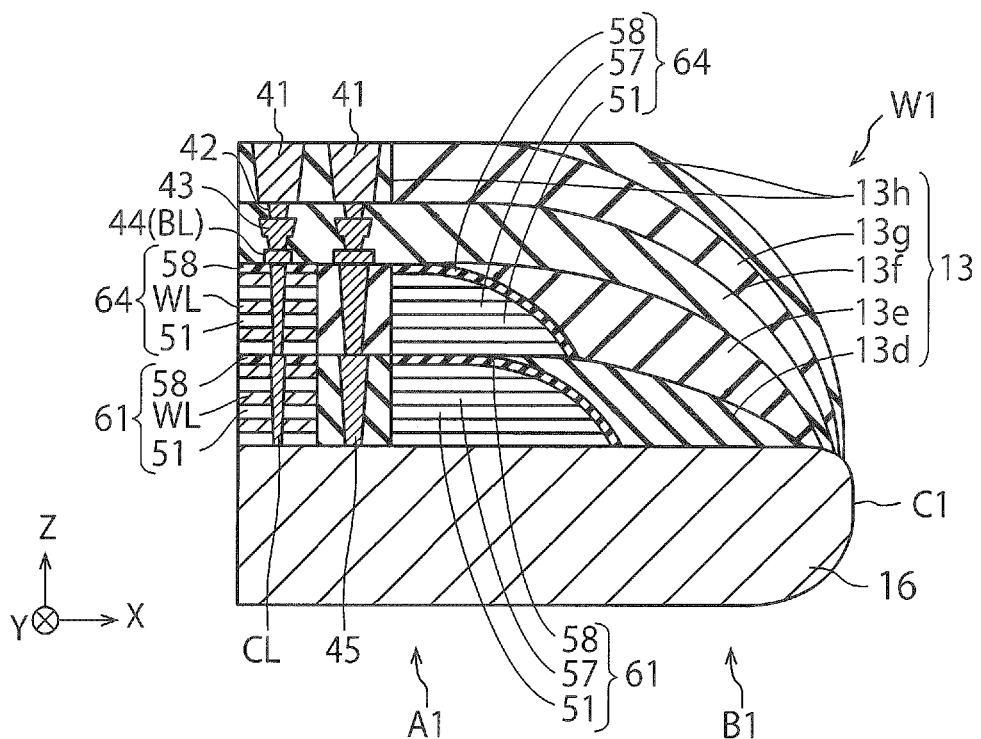
FIGS. 21A and 21B are cross-sectional views illustrating a method of manufacturing the array wafer W1 and the circuit wafer W2 of the second embodiment.

The method includes subsequently forming the metal pads 41 on the via plugs 42, in the insulator 13h (see FIG. 21A). In this manner, the array wafer W1 of the present embodiment is manufactured.

Figure 21B:
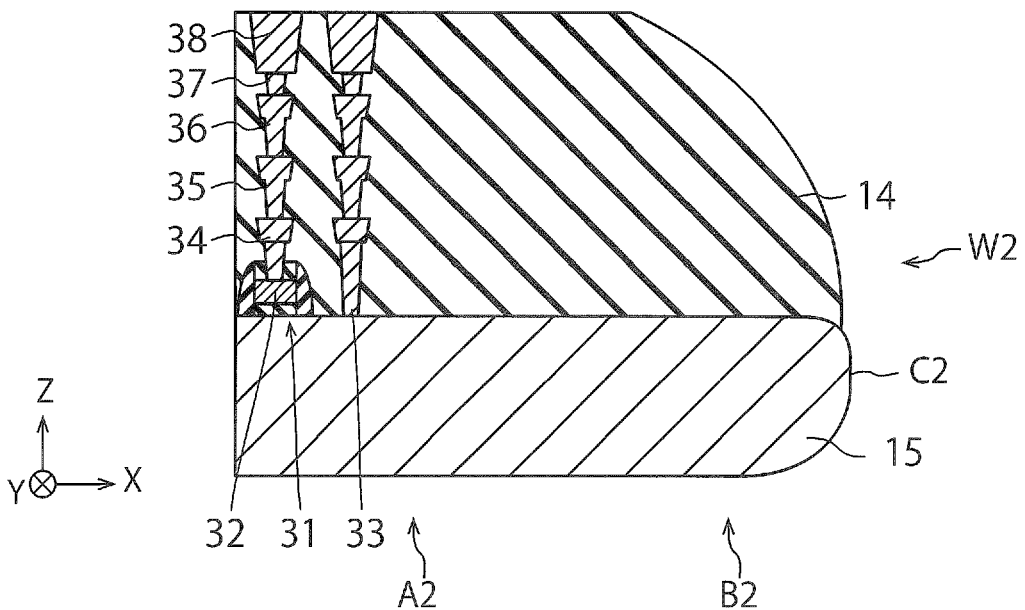

FIG. 21B illustrates the circuit wafer W2 of the present embodiment. FIG. 21B illustrates a substrate 15, an inter layer dielectric 14, a transistor 31 formed in the inter layer dielectric 14, a gate electrode 32, a plurality of contact plugs 33, line layers 34, 35, and 36, a plurality of via plugs 37, and a plurality of metal pads 38. FIG. 21B further illustrates a central portion A2, an edge portion B2, and an outermost portion C2 of the substrate 15, like FIG. 9. The central portion A2 is a region on the central axis side of the substrate 15, and the edge portion B2 is a region on the outermost portion C2 side of the substrate 15. The edge portion B2 of the present embodiment has an annular (ring-like) shape surrounding the central portion A2. Even in this embodiment, the upper face of the edge portion B2 of the substrate 15 may be lower than the upper face of the central portion A2 of the substrate 15. The substrate 15 illustrated in FIG. 21B is a semiconductor wafer before being diced and has a disk shape.

The circuit wafer W2 of the present embodiment may be manufactured by any method, but may be manufactured by processes described with reference to FIG. 9, for example. This makes it possible to set the upper face of the inter layer dielectric 14 above the edge portion B2 to have the same height as the upper face of the inter layer dielectric 14 above the central portion A2.

The inter layer dielectric 13 and the inter layer dielectric 14 of the present embodiment are bonded together, as in the first embodiment, so that the entire central portion A1 of the substrate 16 and the entire central portion A2 of the substrate 15 are in contact with each other (see FIG. 22 described below). As described above, according to the present embodiment, it is possible to reduce the unbonded areas of the inter layer dielectrics 13 and 14, and it is possible to increase the effective chip areas of the array wafer W1 and the circuit wafer W2. This makes it possible to suppress wasteful disposal of the trimming portions of the array wafer W1 and the circuit wafer W2, and reduce wasteful disposal of the edge portions B1 and B2 of the substrates 16 and 15.

Figure 22:
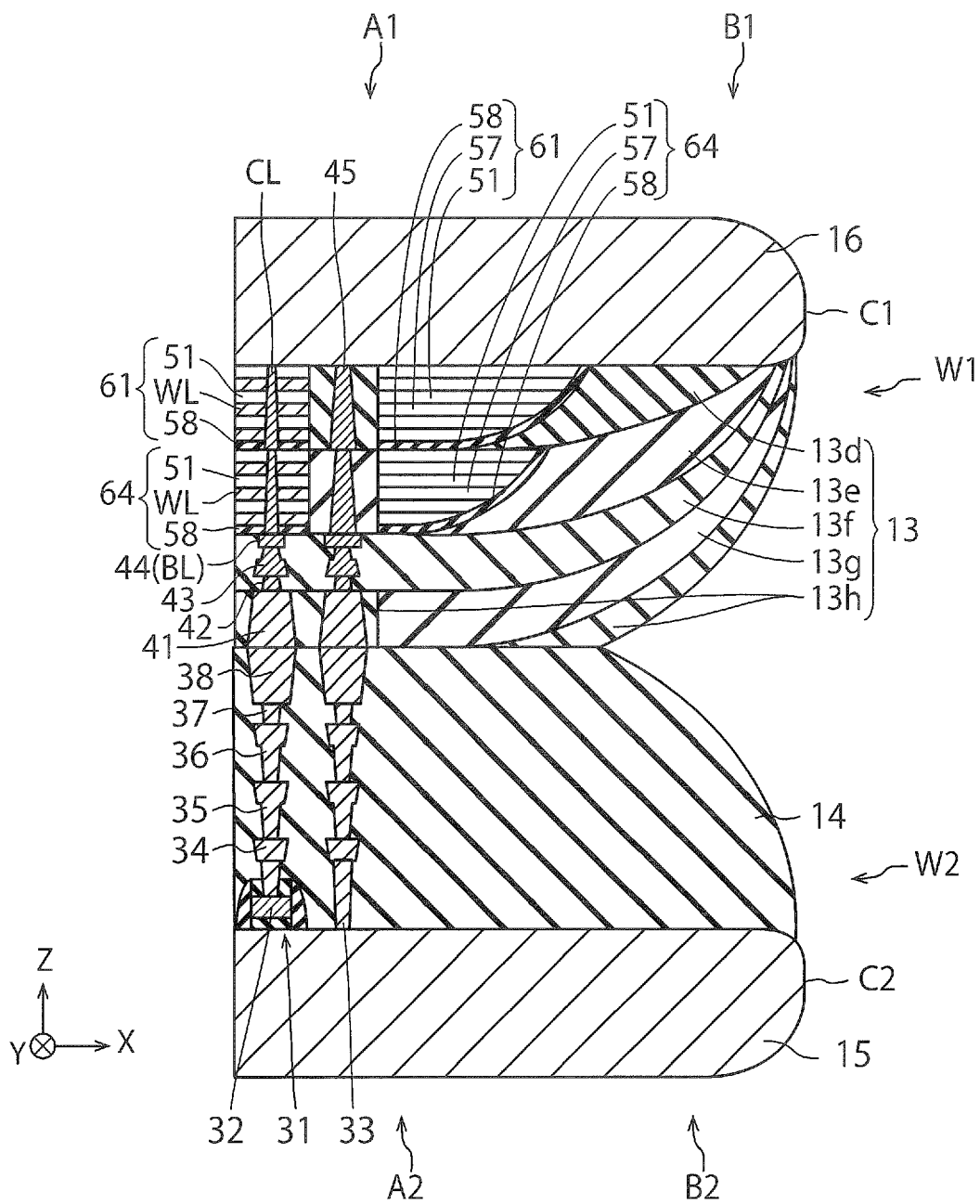
FIGS. 22 and 23 are cross-sectional views illustrating a method of manufacturing the semiconductor device of the second embodiment.
Figure 23:
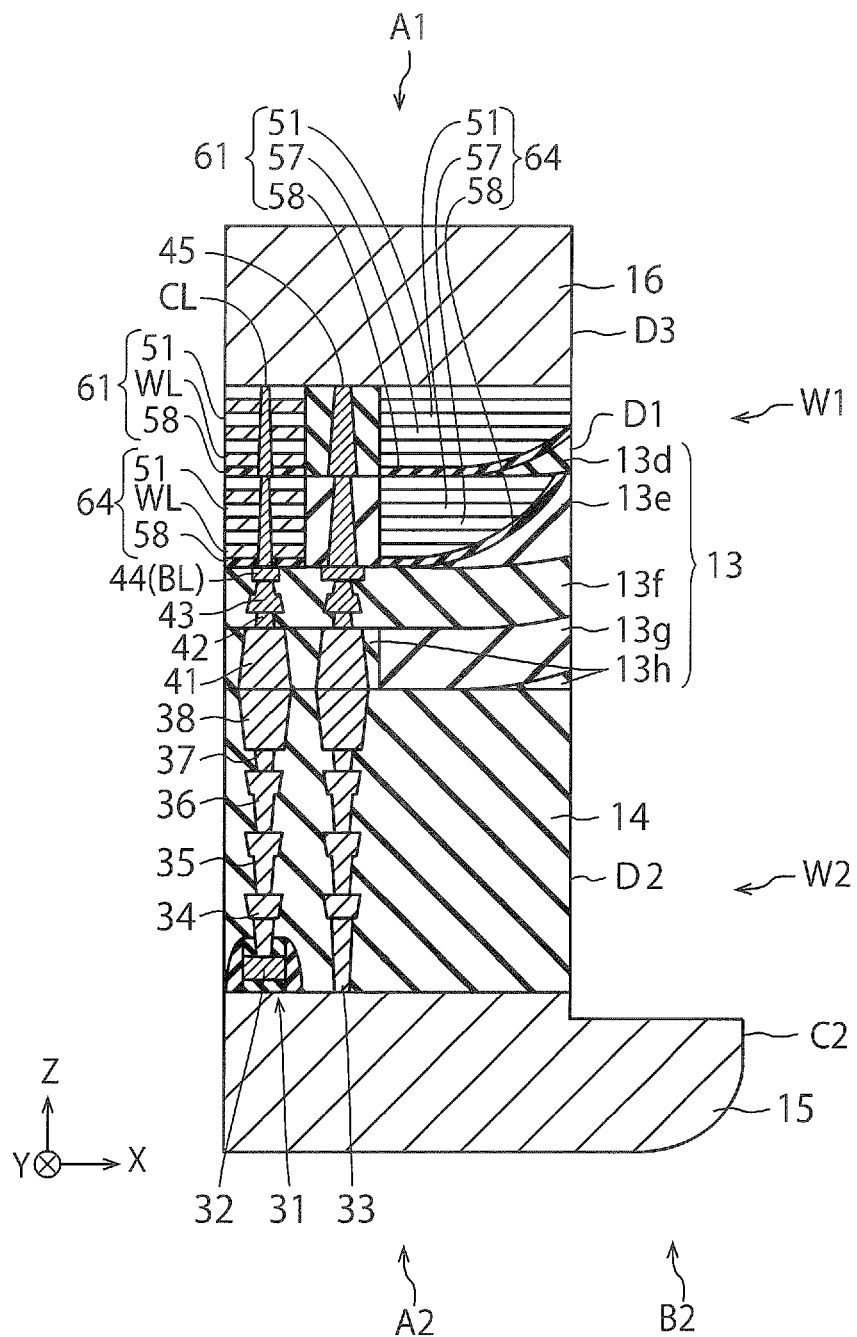

FIGS. 22 and 23 are cross-sectional views illustrating method of manufacturing the semiconductor device of the second embodiment.

Similar to FIG. 4, FIG. 22 illustrates a process of bonding the array wafer W1 and the circuit wafer W2 together. Therefore, the orientation of the array wafer W1 illustrated in FIG. 22 is opposite to the orientation of the array wafer W1 illustrated in FIGS. 12A to 21A.

The inter layer dielectric 13 and the inter layer dielectric 14 of the present embodiment are bonded together, as in the first embodiment, so as to be in contact with each other not only between the central portion A1 of the substrate 16 and the central portion A2 of the substrate 15 but also between the edge portion B1 of the substrate 16 and the edge portion B2 of the substrate 15. As mentioned above, according to the present embodiment, it is possible to reduce the unbonded areas of the inter layer dielectrics 13 and 14, and it is possible to increase the effective chip areas of the array wafer W1 and the circuit wafer W2. This makes it possible to suppress wasteful disposal of the trimming portions of the array wafer W1 and the circuit wafer W2, and reduce wasteful disposal of the edge portions B1 and B2 of the substrates 16 and 15.

FIG. 22 illustrates the metal pads 38 and 41 that are bonded together. The metal pads 38 and 41 of the present embodiment are provided between the central portion A1 of the substrate 16 and the central portion A2 of the substrate 15, and are not provided between the edge portion B1 of the substrate 16 and the edge portion B2 of the substrate 15. Increasing the proportions of the central portions A1 and A2 and decreasing the proportions of the edge portions B1 and B2 can increase effective chip areas of the array wafer W1 and the circuit wafer W2. The array wafer W1 and the circuit wafer W2 illustrated in FIG. 22 are subsequently subjected to trimming illustrated in FIG. 23 and cut into a plurality of chips as mentioned above.

FIG. 23 illustrates the array wafer W1 and the circuit wafer W2 after trimming. In the present embodiment, the trimming is performed to remove the inter layer dielectrics 13 and 14 between the edge portions B1 and B2 of the substrates 16 and 15. At this time, the edge portion B1 of the substrate 16 and a portion of the edge portion B2 of the substrate 15 are removed by trimming.

FIG. 23 illustrates an edge face D1 of the trimmed inter layer dielectric 13, an edge face D2 of the trimmed inter layer dielectric 14, and edge face D3 of the trimmed substrate 16. The edge faces D1, D2, and D3 are trimming faces formed by trimming on the inter layer dielectric 13, the inter layer dielectric 14, and the substrate 16, respectively. Since the inter layer dielectric 13, the inter layer dielectric 14, and the substrate 16 are trimmed in the same trimming process, the edge face D1 is vertically extending above and continuous to the edge face D2 and the edge face D3 is vertically extending above and continuous to the edge face D1. The inter layer dielectric 13 and the inter layer dielectric 14 of the present embodiment are connected to each other between the edge face D1 of the inter layer dielectric 13 and the edge face D2 of the inter layer dielectric 14.

As mentioned above, the inter layer dielectric 13 and the inter layer dielectric 14 of the present embodiment are bonded together so as to be in contact with not only between the central portion A1 of the substrate 16 and the central portion A2 of the substrate 15 but also between the edge portion B1 of the substrate 16 and the edge portion B2 of the substrate 15 (see FIG. 22). Therefore, in the present embodiment, by trimming almost only the inter layer dielectrics 13 and 14 between the edge portions B1 and B2, all of the unbonded areas can be removed. This makes it possible to suppress wasteful disposal of many trimming portions. In FIG. 23, trimmed and removed are almost only the inter layer dielectrics 13 and 14 between the edge portions B1 and B2, of the inter layer dielectrics 13 and 14 between the central portions A1 and A2 and between the edge portions B1 and B2. The array wafer W1 and the circuit wafer W2 illustrated in FIG. 23 are, subsequently, cut into a plurality of chips, as mentioned above. At this time, the substrate 15 (substantially the edge portion B2 of the substrate 15) under the trimming portion is discarded. In the trimming of the present embodiment, the inter layer dielectrics 13 and 14 on the central portions A1 and A2 may be partly removed, or the inter layer dielectrics 13 and 14 on the edge portions B1 and B2 may be partly left.

The trimming face including the edge faces D1 and D2 of the present embodiment (see FIG. 23) passes in the vicinity of the tip of the stairway portion of the stacked film 64. Therefore, in the trimming of the present embodiment, a tip side portion of the stairway portion of the stacked film 61 is removed, and the rest of the stairway portion of the stacked film 61 remains (see FIG. 23). On the other hand, in the trimming of the present embodiment, almost all of the stairway portion of the stacked film 64 remains (see FIG. 23). As a result, the inter layer dielectric 13 illustrated in FIG. 23 intervenes between the inter layer dielectric 14 and the stacked film 64 (the stairway portion) at the edge faces D1 and D2 of the inter layer dielectrics 13 and 14. On the edge face D1 of the inter layer dielectric 13 illustrated in FIG. 23, the insulators 13d to 13h are present under the stacked film 61, and the insulators 13e to 13h are present under the stacked film 64. Further, the stacked film 64 (the stairway portion) illustrated in FIG. 23 is disposed under the stacked film 61 (the stairway portion) via a portion of the inter layer dielectric 13. The inter layer dielectric 13 partly intervenes between the stacked film 61 and the stacked film 64. As described above, in the present embodiment, by reducing the trimming portion, the insulators 13d to 13h almost remain after trimming.

As mentioned above, the inter layer dielectric 13 and the inter layer dielectric 14 of the present embodiment are in contact with each other not only between the central portion A1 of the substrate 16 and the central portion A2 of the substrate 15 but also between the edge portion B1 of the substrate 16 and the edge portion B2 of the substrate 15, as illustrated in FIG. 22. Therefore, according to the present embodiment, it is possible to reduce wasteful disposal of the edge portions B1 and B2 of the substrates 16 and 15. For example, according to the present embodiment, the inter layer dielectrics 13 and 14 to be removed by trimming can be limited to almost only the inter layer dielectrics 13 and 14 between the edge portions B1 and B2, and the inter layer dielectrics 13 and 14 between the central portions A1 and A2 can be almost left after trimming. Further, according to the present embodiment, the substrate 16 to be removed by trimming can be limited to almost only the edge portion B1 of the substrate 16, and the central portion A1 of the substrate 16 can be almost left after trimming. In this case, the substrate 15 discarded due to trimming can be limited to almost only the edge portion B2 of the substrate 15.

Further, the inter layer dielectrics 13 and 14 of the present embodiment are trimmed at a position where the inter layer dielectric 13 intervenes between the inter layer dielectric 14 and the stacked film 64 at the edge faces D1 and D2 of the inter layer dielectrics 13 and 14. Therefore, according to the present embodiment, the edge faces D1 and D2 of the inter layer dielectrics 13 and 14 can be disposed close to the outermost portions C1 and C2 of the substrates 15 and 16, and it is possible to reduce wasteful disposal of the edge portions B1 and B2 of the substrates 16 and 15.

While certain embodiments have been described, these embodiments have been presented by way of example only, and are not intended to limit the scope of the inventions. Indeed, the novel wafers and methods described herein may be embodied in a variety of other forms; furthermore, various omissions, substitutions and changes in the form of the wafers and methods described herein may be made without departing from the spirit of the inventions. The accompanying claims and their equivalents are intended to cover such forms or modifications as would fall within the scope and spirit of the inventions.

The invention claimed is:

1. A semiconductor wafer comprising:
a first substrate;
a first insulator provided on the first substrate;
a plurality of first pads provided in the first insulator;
a second insulator provided on the first insulator;
a plurality of second pads provided on the first pads in the second insulator;
a stacked film alternately including a plurality of first insulating layers and a plurality of second insulating layers provided in the second insulator; and
a second substrate provided on the second insulator, wherein
the first insulator and the second insulator are connected to each other between an edge face of the first insulator and an edge face of the second insulator,
the second insulator intervenes between the first insulator and the stacked film at the edge faces of the first and second insulators; and
the edge face of the first insulator, the edge face of the second insulator, and an edge face of the stacked film are a trimming face of the first insulator, a trimming face of the second insulator, and a trimming face of the stacked film, respectively.

2. The wafer of claim 1, wherein the stacked film includes:
a first stacked film alternately including the first insulating layers and the second insulating layers, and
a second stacked film alternately including the first insulating layers and the second insulating layers, and provided under the first stacked film via a portion of the second insulator.

3. The water of claim 1, further comprising a plurality of electrode layers provided at heights that are same as heights of the plurality of the second insulating layers.

4. The wafer of claim 1, wherein an edge face of the second substrate is provided on the edge face of the second insulator.

5. The wafer of claim 4, wherein the edge face of the second substrate is a trimming face of the second substrate.

6. The wafer of claim 1, further comprising:
a memory cell array provided in the second insulator above the first substrate, and electrically connected to a second pad, and a control circuit provided in the first insulator on the first substrate, electrically connected to a first pad, and configured to control the memory cell array.

7. The wafer of claim 1, wherein the first insulating layer includes silicon and oxygen, and the second insulating layer includes silicon and nitrogen.

\* \* \* \* \*